(12) United States Patent
Kondo et al.

(10) Patent No.: US 6,998,676 B2
(45) Date of Patent: Feb. 14, 2006

(54) DOUBLE-GATE STRUCTURE FIN-TYPE TRANSISTOR

(75) Inventors: Masaki Kondo, Kawasaki (JP); Ryota Katsumata, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 16 days.

(21) Appl. No.: 10/744,756

(22) Filed: Dec. 23, 2003

(65) Prior Publication Data

US 2004/0150071 A1 Aug. 5, 2004

(30) Foreign Application Priority Data

Dec. 27, 2002 (JP) .............................. 2002-382384

(51) Int. Cl.
*H01L 29/76* (2006.01)
(52) U.S. Cl. .................. 257/329; 257/330; 257/331; 257/332; 438/212; 438/259; 438/270; 438/271
(58) Field of Classification Search ................ 438/212, 438/259, 270, 271, 585, 589, 587, 283, 285, 438/286; 257/329–332, 327, 331, 347, 349
See application file for complete search history.

(56) References Cited

U.S. PATENT DOCUMENTS

2002/0036290 A1 * 3/2002 Inaba et all. .................. 257/66

FOREIGN PATENT DOCUMENTS

| JP | 2-263473 | 10/1990 |
|---|---|---|
| JP | 3-245573 | 11/1991 |
| JP | 5-48109 | 2/1993 |
| JP | 8-139325 | 5/1996 |
| JP | 2002-118255 | 4/2002 |

OTHER PUBLICATIONS

G. Pei et al., "*FinFet Design Considerations Based on 3-D Simulation and Analytical Modeling,*" IEEE Transactions on Electron Devices, vol. 49, No. 8, Aug. 2002, pp. 1411-1419.

* cited by examiner

*Primary Examiner*—Donghee Kang
(74) *Attorney, Agent, or Firm*—Frommer Lawrence & Haug LLP

(57) ABSTRACT

A semiconductor device has a fin-type transistor formed in a projecting semiconductor region. The projecting semiconductor region is formed on a major surface of a semiconductor substrate of a first conductivity type. A gate electrode of the fin-type transistor is formed on at least opposed side surfaces of the projecting semiconductor region, with a gate insulating film interposed. Source and drain regions are formed in the projecting semiconductor region such that the source and drain regions sandwich the gate electrode. A channel region of the first conductivity type is formed in the projecting semiconductor region between the source and drain regions. The following relationship is established:

$$T_{FIN} \geq (\in/4qN_{CH})^{1/2}$$

where $T_{FIN}$ is a width of the projecting semiconductor region, $N_{CH}$ is an impurity concentration in the channel region, $\in$ is a dielectric constant of a semiconductor material of the projecting semiconductor region, and q is an elementary charge.

14 Claims, 20 Drawing Sheets

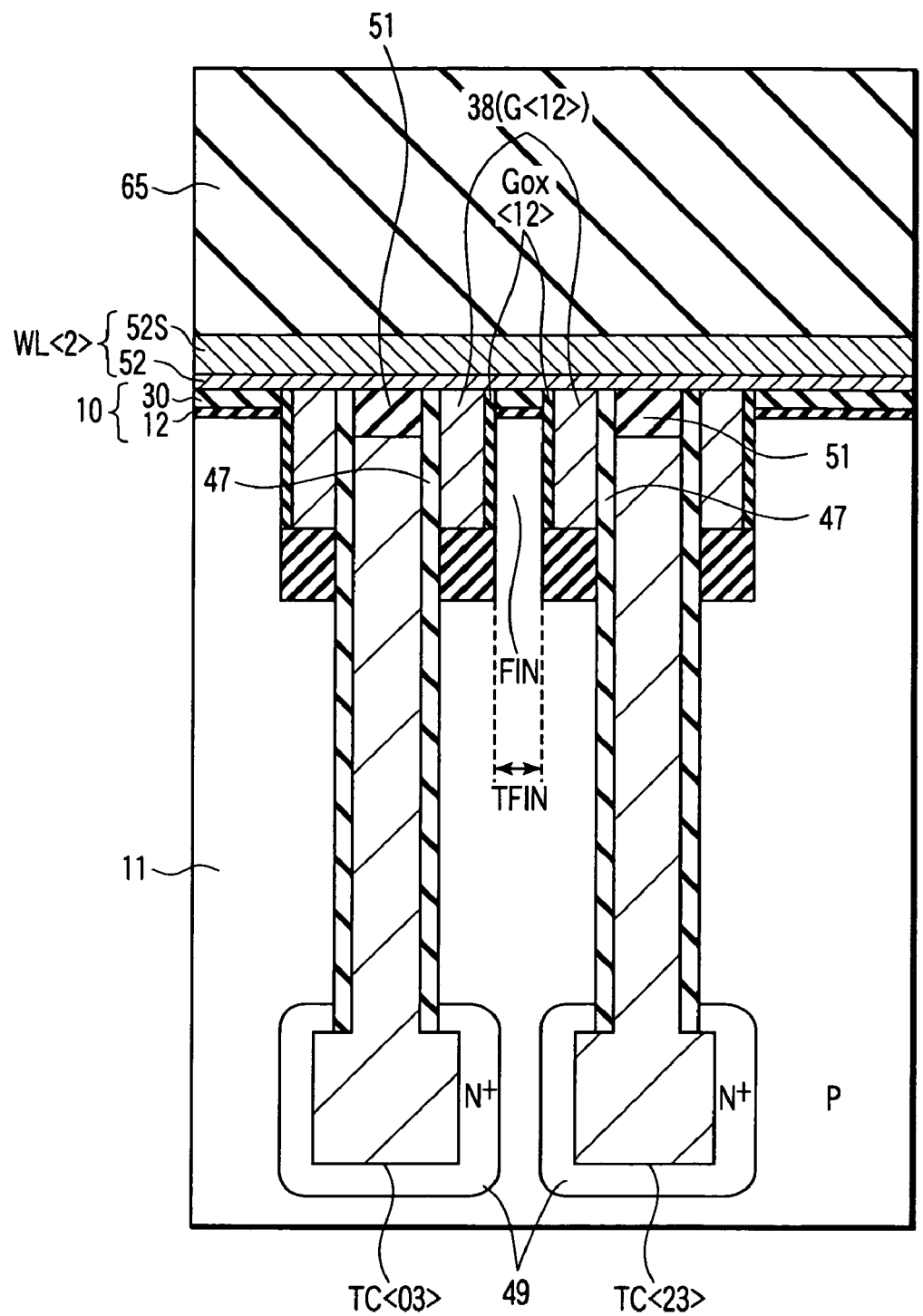
F I G. 5

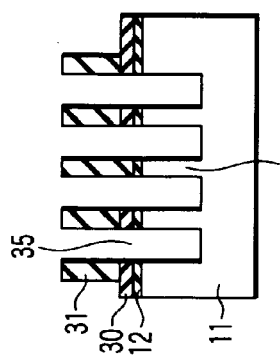
FIG. 9A
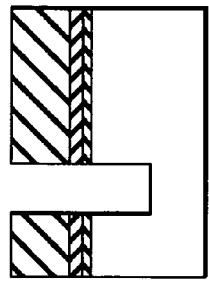
FIG. 9B
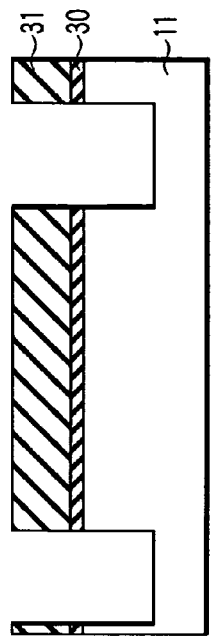
FIG. 9C
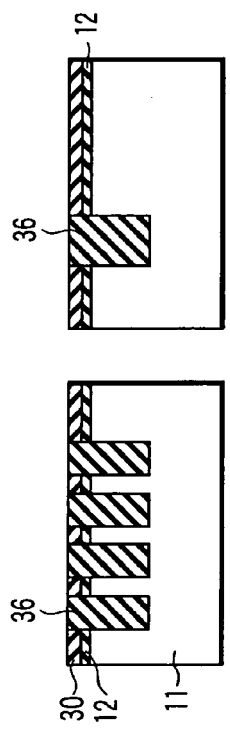
FIG. 10A
FIG. 10B
FIG. 10C
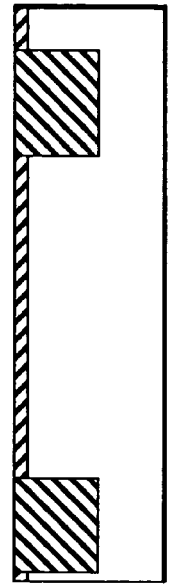
FIG. 11A
FIG. 11B
FIG. 11C

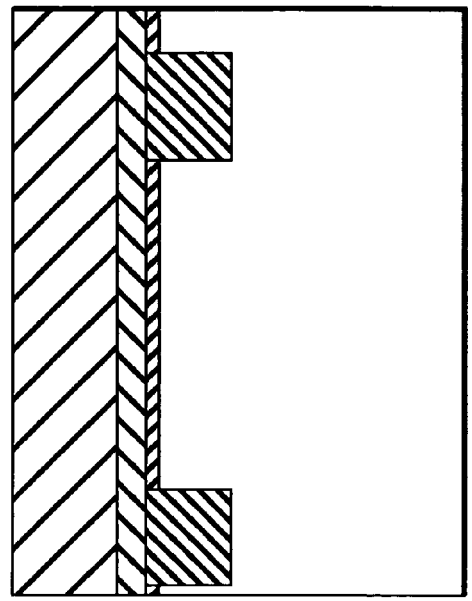
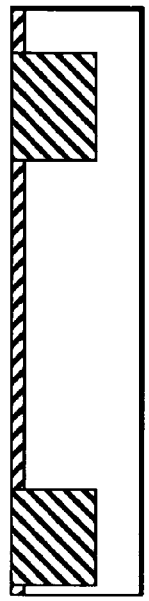
FIG.12C   FIG.16C
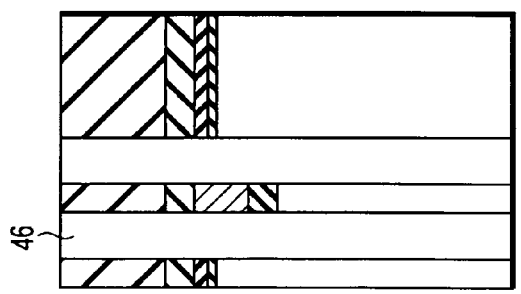
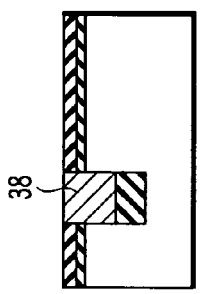
FIG.12B   FIG.16B
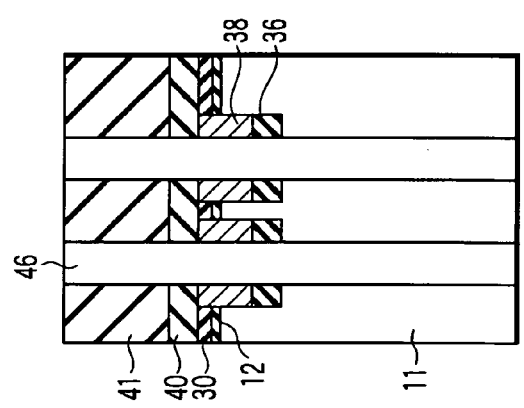
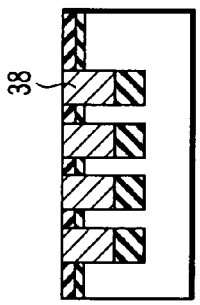
FIG.12A   FIG.16A

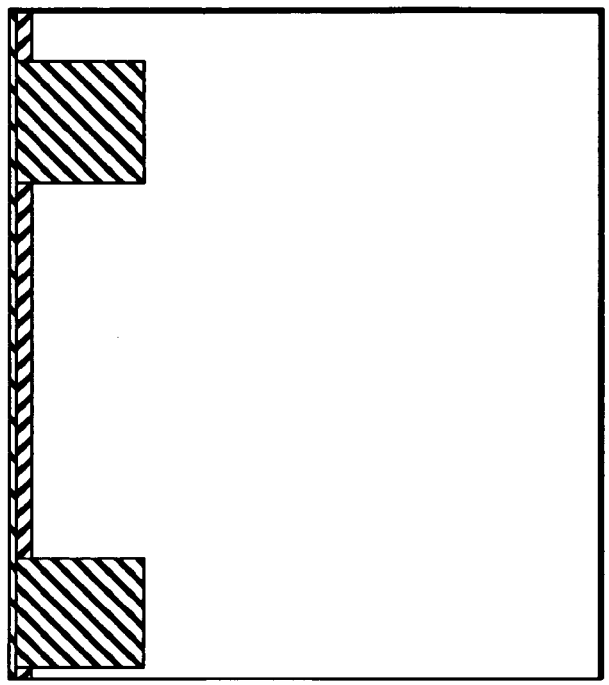
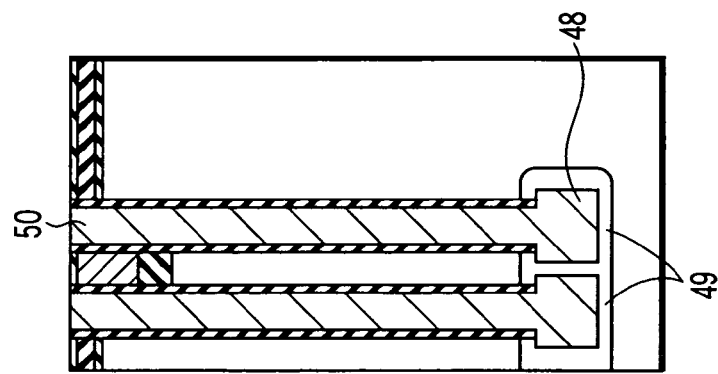
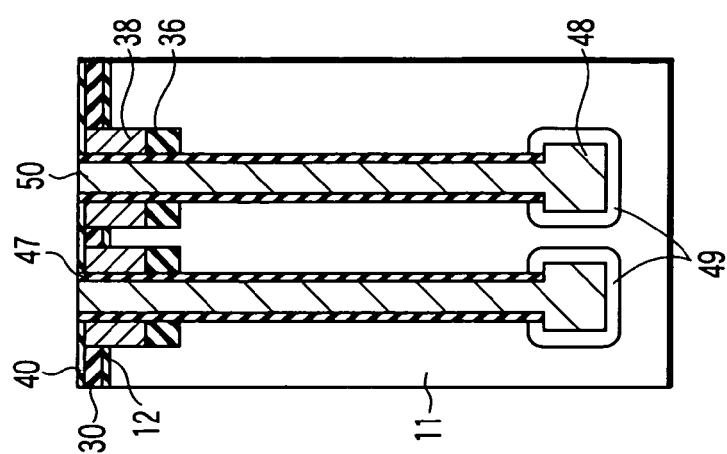
FIG. 18C
FIG. 18B
FIG. 18A

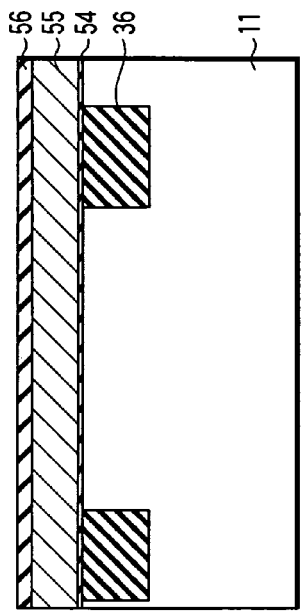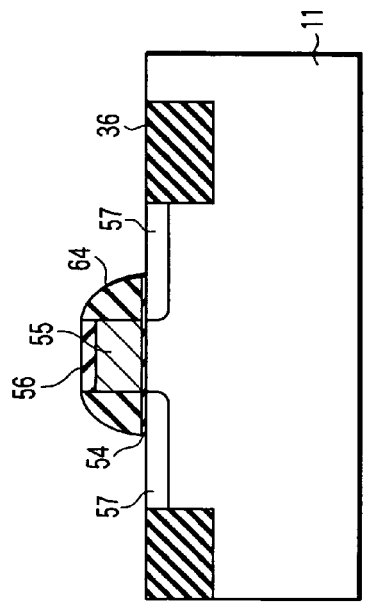
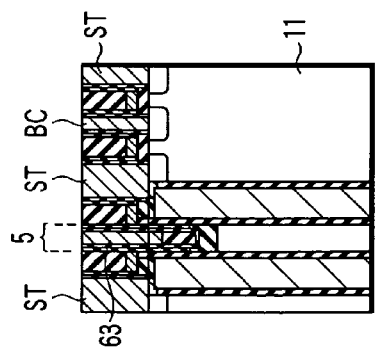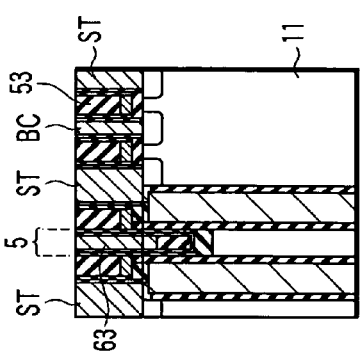
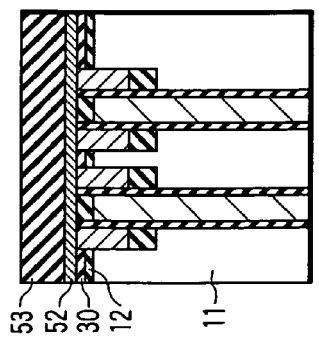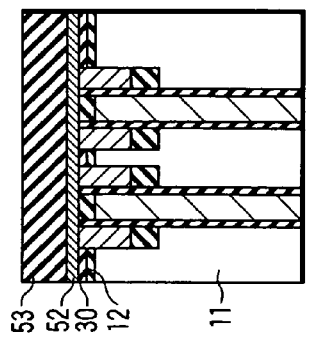
FIG. 25A  FIG. 25B  FIG. 25C
FIG. 26A  FIG. 26B  FIG. 26C

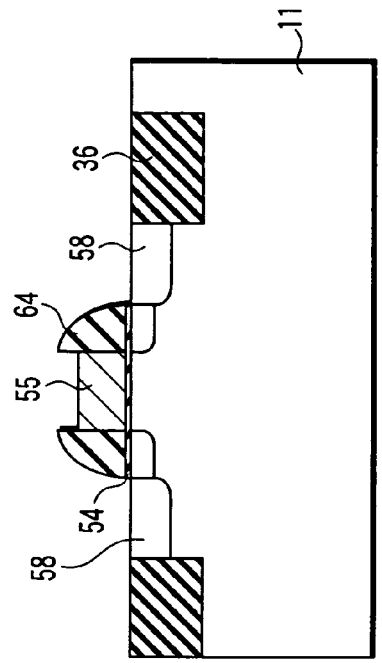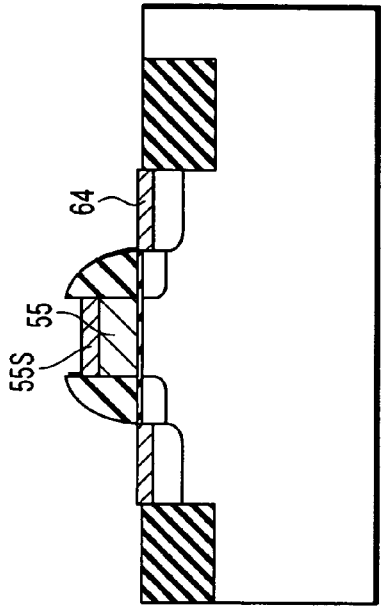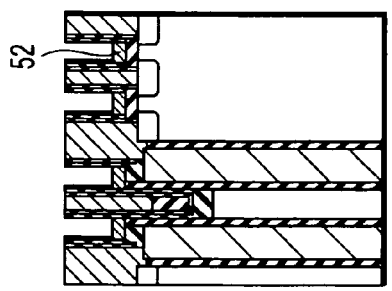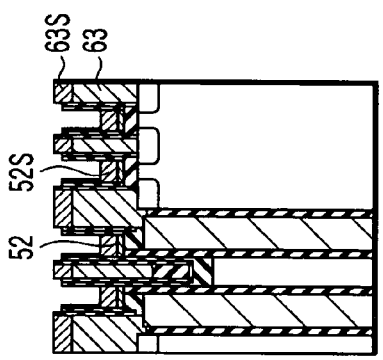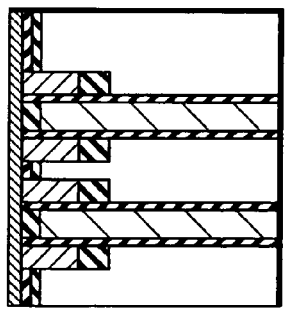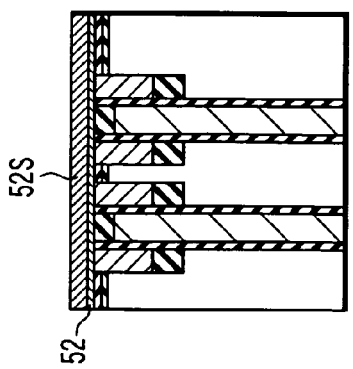
FIG. 27A  FIG. 27B  FIG. 27C
FIG. 28A  FIG. 28B  FIG. 28C

DOUBLE-GATE STRUCTURE FIN-TYPE TRANSISTOR

CROSS-REFERENCE TO RELATED APPLICATIONS

This application is based upon and claims the benefit of priority from the prior Japanese Patent Application No. 2002-382384, filed Dec. 27, 2002, the entire contents of which are incorporated herein by reference.

BACKGROUND OF THE INVENTION

1. Field of the Invention

The present invention relates generally to a semiconductor device, and more particularly to a double-gate structure fin-type transistor wherein a projecting semiconductor region (generally called "fin" or "pillar", hereinafter referred to as "pillar") is formed on a major surface of a semiconductor substrate, and the pillar is provided with a gate electrode, a channel region, a source region, a drain region, etc.

2. Description of the Related Art

The development in semiconductor integrated circuits (ICs) is greatly dependent on scaling rules, which are excellent characteristics, of their structural components, MOSFETs (Metal-Oxide-Semiconductor Field Effect Transistors). The smaller the dimensions of each component or semiconductor device, the higher the integration density of components in a limited chip area. It is expected, however, that miniaturization based on conventional MOSFET technology will reach a limit in the near future. One of the factors is that off-leak current increases as the degree of miniaturization increases. If the power supply voltage is lowered due to reduction in device dimensions, the gate voltage (threshold voltage), at which the channel is rendered conductive, needs to be lowered accordingly. On the other hand, the ratio (sub-threshold coefficient) of the drain current to the gate voltage in the cut-off state is basically unchanged even if the device dimensions are reduced. Thus, the off-leak current increases. In addition, the off-leak current increases on the order of magnitude. For example, it is estimated that in CMOS logic circuits, if the gate length decreases to about 50 nm, the off-state power consumption due to off-leak current begins to surpass the on-state power consumption and then rises sharply. In such a case, because of a problem of heat production, the integration density cannot be increased even if the dimensions of each device component are reduced. In memory cells of a DRAM (Dynamic Random Access Memory), the magnitude of off-leak current poses a serious problem since it directly affects the voltage retaining performance of storage nodes. If the threshold voltage is raised in order to decrease the off-leak current, a sufficient drive current cannot be obtained. If the impurity concentration is increased according to the scaling rules, the leak current at the PN junction or channel surface increases. Hence, memory cells cannot be formed with the conventional MOSFET structure. As is understood from the above, in the future miniaturization of semiconductor ICs, it is imperative to solve the problem of how the off-leak current of the semiconductor device should be suppressed.

A prospective solution to the problem of off-leak current is a fin-type transistor.

Prior-art techniques relating to the control of off-leak current in the fin-type transistor are as follows:

1. A projecting semiconductor region and a substrate are insulated by an oxide film (Jpn. Pat. Appln. KOKAI Publication No. H02-263473).

2. A high-concentration region is provided under the pillar, thereby insulating the channel region and substrate (Jpn. Pat. Appln. KOKAI Publication No. H03-245573).

3. A high-concentration region is provided at a center of the pillar (Jpn. Pat. Appln. KOKAI Publication No. H03-245573).

4. An LDD (Lightly Doped Drain) structure is applied to the source/drain region (Jpn. Pat. Appln. KOKAI Publication No. H05-048109).

5. A source/drain region is set off relative to the gate electrode (Jpn. Pat. Appln. KOKAI Publication No. 2002-118255).

6. Source and drain regions are independently provided on both sides of the pillar (Jpn. Pat. Appln. KOKAI Publication No. H08-139325).

7. A distance between the source and drain regions is varied within the pillar (Jpn. Pat. Appln. KOKAI Publication No. 2002-118255).

Techniques 1 to 3 aim at reducing the leak current due to punch-through, from the standpoint of a current path. In the fin-type transistor, a punch-through current path may easily form in the vicinity of a substrate junction under the pillar, where the gate electrode does not cover, and in the central part of the pillar. In technique 1, the current path under the pillar is insulated by the oxide film. In technique 2, the current path is narrowed by raising a potential barrier in the current path. In technique 3, the current path in the central part of the pillar is similarly narrowed. Techniques 4 to 7 also relate to measures to cope with leak current due to punch-through. In technique 4, as in the conventional MOSFET structure, the drain is formed thin and shallow, thereby preventing lowering of a potential barrier in the channel. In technique 5, the current path between the drain and source is increased as a whole. In technique 6, the current path is increased in the central part of the pillar. In technique 7, the current path is increased mainly under the pillar.

Even if the above prior-art techniques are combined, however, it is difficult to realize a fin-type transistor that exhibits such a performance that off-leak current is $1 \times 10^{-16}$ ampere or less, which is required for, e.g. a transistor of a DRAM memory cell. The reason is that the method of controlling the width between both side surfaces of the pillar is not specified, or the method, if specified, is unclear.

The specification of the width of the pillar will now be explained.

If the width of the pillar is too large, transistors on both sides of the pillar will operate independently, and the advantage of the fin-type transistor will obviously be lost. Therefore, the width of the pillar has to be decreased to some degree.

There are various opinions that the width of the pillar should be less than the gate length, less than 7/10 of the gate length, or less than 1/4 of the gate length. On the other hand, there is known a fin-type transistor wherein the width of the pillar is limited to $2\sqrt{2}(\in S \phi F/q \cdot Nsub)^{1/2}$ or less, in consideration of the relation to the width of the depletion layer just under the gate. In this expression, $\in S$ is a dielectric constant of the material of the pillar, $\phi F$ is a Fermi level of the same semiconductor material, q is an elementary charge, and Nsub is the concentration in the channel.

However, in the former empirical rule, the relation to the channel concentration is not included. In the latter specification, the relation to the gate length is not included. Thus, if the channel concentration is 1×10$^{17}$ cm$^{-3}$, it should suffice if the width of the pillar is about 0.3 μm according to the latter specification. However, according to the former empirical rule, e.g. the rule that the pillar width is less than the gate length, if the gate length is 0.1 μm, the pillar width (0.3 μm) is greater than the gate length (0.1 μm) and the former rule is not satisfied. This is because only the pillar width is excessively evaluated.

Besides the gate length and the concentration in the channel, there are other factors that determine the off-leak current. These include the thickness of the gate oxide film and the concentration in the source/drain region. There are no prior-art documents mentioning these factors. It is thus difficult to realize the performance associated with off-leak current, based on the conventional empirical rule or specification of the pillar width. On the other hand, if the pillar width is too small, it becomes difficult to control the threshold voltage by the concentration in the channel region. If the controllability of the threshold voltage by the concentration in the channel region lowers, the sole method for controlling the threshold voltage is to alter the material of the gate electrode. This leads to an increase in cost of device design and manufacture. In particular, in the transistor of the DRAM in which the concentration in the channel region cannot be increased, it is considered that the tolerable range of width of the pillar becomes narrow. However, there is to prior-art document mentioning this point.

As has been discussed above, even where the fin-type transistor structure is used, it is difficult in the prior art to realize such performance that the off-leak current is set at 1×10$^{16}$ cm$^{-3}$ or less, while satisfying the condition that the threshold voltage can be controlled by the concentration in the channel region. In the near future, this will inevitably lead to an increase in design and manufacturing costs of integrated circuits.

BRIEF SUMMARY OF THE INVENTION

According to an aspect of the present invention, there is provided a semiconductor memory device with a fin-type transistor comprising: a projecting semiconductor region formed on a major surface of a semiconductor substrate of a first conductivity type; a gate electrode formed on at least opposed side surfaces of the projecting semiconductor region, with a gate insulating film interposed; source and drain regions of a second conductivity type formed in the projecting semiconductor region such that the source and drain regions sandwich the gate electrode; a channel region of the first conductivity type formed in the projecting semiconductor region between the source and drain regions; and a device isolation insulating film formed on the semiconductor substrate such that the device isolation insulating film is interposed between the projecting semiconductor region and the semiconductor substrate, wherein the following relationship is established: $T_{FIN} \geq (\in/4qN_{CH})^{1/2}$, where $T_{FIN}$ is a width of the projecting semiconductor region, $N_{CH}$ is an impurity concentration in the channel region, $\in$ is a dielectric constant of a semiconductor material of the projecting semiconductor region, and q is an elementary charge.

BRIEF DESCRIPTION OF THE SEVERAL VIEWS OF THE DRAWING

FIG. 5 is a view for describing the semiconductor device according to the embodiment of the invention, FIG. 5 being a cross-sectional view taken along line 5—5 in FIG. 3;

FIGS. 7A, 8A, 9A, 10A, 11A, 12A, 13A, 14A, 15A, 16A, 17A, 18A, 19A, 20A, 21A, 22A, 23A, 24A, 25A, 26A, 27A, 28A and 29A are cross-sectional views taken along line 4—4 in FIG. 3, illustrating manufacturing steps in succession;

FIGS. 7B, 8B, 9B, 10B, 11B, 12B, 13B, 14B, 15B, 16B, 17B, 18B, 19B, 20B, 21B, 22B, 23B, 24B, 25B, 26B, 27B, 28B and 29B are cross-sectional views taken along line 5—5 in FIG. 3, illustrating manufacturing steps in succession; and FIGS. 7C, 8C, 9C, 10C, 11C, 12C, 13C, 14C, 15C, 16C, 17C, 18C, 19C, 20C, 21C, 22C, 23C, 24C, 25C, 26C, 27C, 28C and 29C are cross-sectional views illustrating manufacturing steps in succession of peripheral circuits, such as address buffers, provided in the vicinity of the memory cell array.

DETAILED DESCRIPTION OF THE INVENTION

[First Embodiment]

Figure 1:
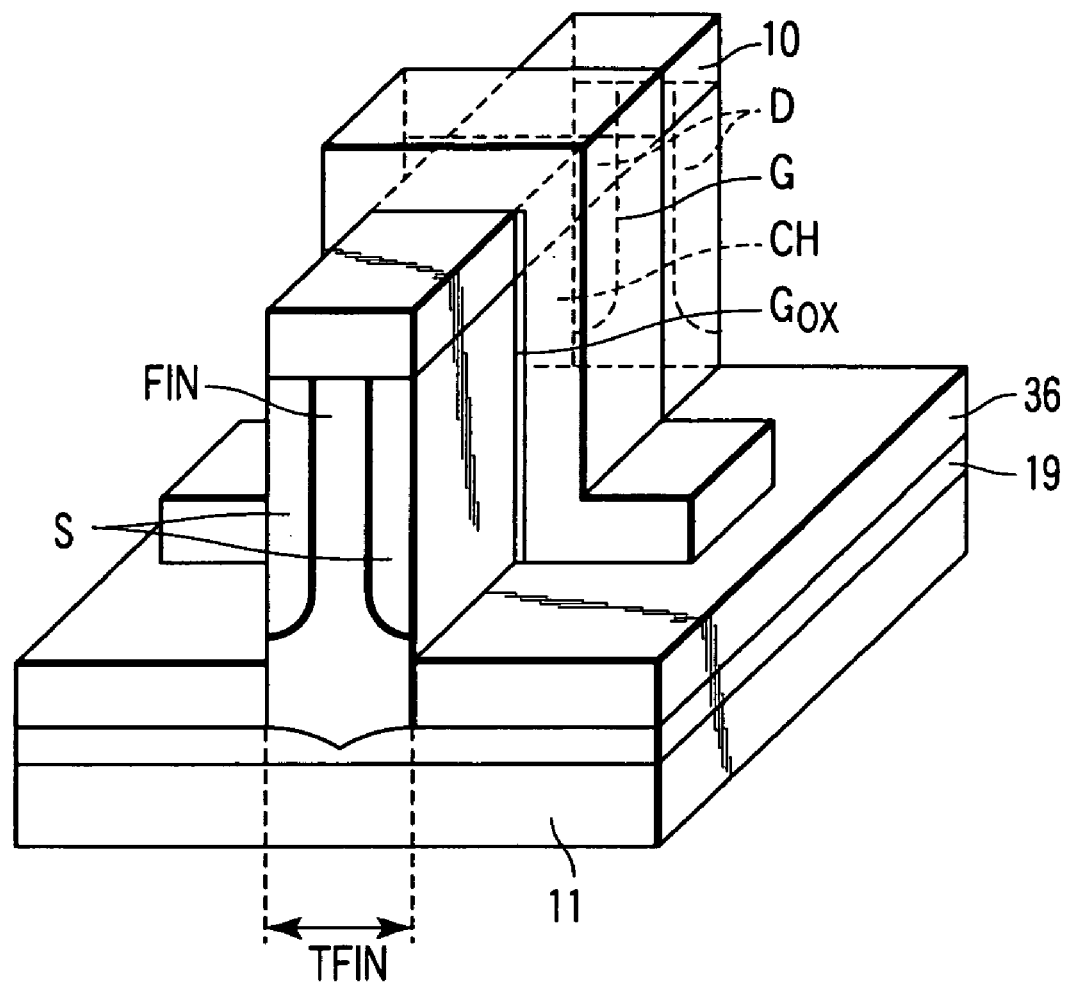
FIG. 1 is a perspective view showing the structure of a fin-type transistor according to an embodiment of the present invention.

FIG. 1 is a perspective view showing the structure of a fin-type transistor according to an embodiment of the present invention. As is shown in FIG. 1, a P-type silicon semiconductor substrate 11 is processed to have a projecting shape, thus forming a pillar FIN (also called "fin", but hereinafter referred to as "pillar") that is a device region. The height of the pillar FIN is less than about 0.3 to 1.0 μm. Alternatively, the height may be greater than these values. Device isolation insulating regions 36, which serve as device isolation regions, are formed on the P-type silicon substrate 11 on both sides of the pillar FIN.

A gate insulating film $G_{OX}$ is formed on both side surfaces and a top surface of the pillar FIN. The gate insulating film $G_{OX}$ is formed so as to cover the pillar FIN. The gate insulating film $G_{OX}$ is, for example, a silicon oxide film formed by thermal oxidation. The thickness of the gate insulating film $G_{OX}$ is, e.g. about 5 nm. A gate electrode G is provided on the gate insulating film $G_{OX}$ so as to sandwich the pillar FIN. The gate electrode G is formed of polysilicon in which boron, for instance, is introduced. Using the polysilicon containing boron for the gate electrode G, a threshold voltage applied to the gate electrode G can be set at a value (about 1V) suitable for a decrease in off-leak current. The concentration of the boron introduced in the gate electrode G is, e.g. about 1×10$^{20}$ cm$^{-3}$.

An insulating film 10 is formed on the upper surface of the pillar FIN, thereby to suppress inversion of the pillar FIN. The thickness of the insulating film 10 is less than, e.g. about 0.1 μm.

A source region S and a drain region D having a conductivity type (N-type) opposite to the conductivity type (P-type) of the silicon substrate 11 are formed in both side surface portions of the pillar FIN, as viewed in a direction perpendicular to the face of the sheet of FIG. 1. The source region S and drain region D are formed after the formation of the gate electrode G in a self-alignment manner, using the pattern of the gate electrode G as a mask. Specifically, phosphorus (P) or arsenic (As) is introduced, for example, by ion-implantation, in both side surface portions of the pillar FIN except a lower part of the gate electrode G. In addition, boron (B), for instance, is ion-implanted for adjustment of the threshold voltage in a channel region CH formed between the source region S and drain region D at an upper part of the pillar FIN.

An impurity region 19 for electrical isolation between the silicon substrate 11 and the channel region CH is formed under the pillar FIN. The impurity region 19 has the same conductivity type (P-type) as the silicon substrate 11 and has a higher impurity concentration than the channel region. In the impurity region 19, boron (B), for instance, is introduced by ion-implantation. The concentration of boron is less than, e.g. about $1 \times 10^{18}$ cm$^{-3}$. The impurity region 19 is connected in the silicon substrate 11 below the pillar FIN. By virtue of this structure, electrical insulation is effected between the silicon substrate 11 and the channel region. Alternatively, the silicon substrate 11 and the channel region can be insulated by burying an insulating film therebetween. In this case, an SOI (Silicon On Insulator) substrate, for example, can be used.

In the above-described fin-type transistor, a width $T_{FIN}$ of the pillar FIN in the channel region in FIG. 1 falls within the range defined by the following formulae (1) and (2):

$$T_{FIN} \geq (\in/4qN_{CH})^{1/2} \quad (1)$$

$$T_{FIN} \leq a(T_{OX}, N_{CH}, N_{SD}) \times \exp(b(T_{OX}, N_{CH}, N_{SD}) \times L_G) \quad (2)$$

where $a(T_{OX}, N_{CH}, N_{SD}) = 0.0173 \times (1 - 76.3 \times T_{OX} - 2.43 \times 10^{-19} \times N_{CH} - 1.57 \times 10^{-20} \times N_{SD})$, and $b(T_{OX}, N_{CH}, N_{SD}) = 8.21 \times (1 + 116 \times T_{OX} + 4.38 \times 10^{-18} \times N_{CH} + 1.63 \times 10^{-20} \times N_{SD})$.

In formula (1), $N_{CH}$ is the impurity concentration in the channel region, $\in$ is the dielectric constant of material (silicon in this embodiment) of the pillar FIN, and q is the elementary charge. In formula (2), $T_{OX}$ is the thickness of the gate insulating film $G_{OX}$, $N_{SD}$ is the impurity concentration in the source region S/drain region D, and $L_G$ is the gate length.

By setting the pillar width $T_{FIN}$ based on the formulae (1) and (2), the threshold current Vth can be controlled by the impurity concentration $N_{CH}$ of the channel region and at the same time the off-leak current can be suppressed to $1 \times 10^{-16}$ ampere or less. Specifically, since the dielectric constant $\in$ and the elementary charge q in formula (1) are determined by the material of the pillar, they take constant values when silicon, for instance, is used as in the present embodiment. Hence, the minimum tolerable width $T_{FIN-MIN}$ of the pillar in the channel region is first determined by substituting a desired impurity concentration $N_{CH}$ of the channel region.

As regards formula (2), too, the maximum tolerable width $T_{FIN-MAX}$ can be determined by substituting desired values for the thickness $T_{OX}$ of the gate insulating film, the impurity concentration $N_{SD}$ of the source region S/drain region D, the gate length $L_G$, and the thickness $T_{OX}$ of the gate insulating film $G_{OX}$. In particular, as will be described later, even if the gate length $L_G$ is 0.1 μm or less, the off-leak current can be suppressed to $1 \times 10^{-16}$ or less by satisfying the maximum tolerable width $T_{FIN-MAX}$ according to formula (2). A description will now be given of an example wherein specific values are substituted in formulae (1) and (2).

To begin with, assume a case where the gate length $L_G$ is sufficiently great and the condition of formula (2) is not considered. If one dimension, i.e. the width direction, of the pillar FIN in FIG. 1 is considered, the relationship between the potential φs at the surface of the pillar FIN just below the gate insulating film $G_{OX}$ and the potential φo at the central part of the pillar FIN may be approximated by the following equation (3):

$$\phi s - \phi o = (qN_{CH}/2\in)(T_{FIN}/2)^2 \quad (3)$$

Equation (3) demonstrates that as the pillar width $T_{FIN}$ decreases, the internal potential of the pillar FIN becomes more uniform. The reason is that a potential decrease due to a depletion layer weakens. This means that the depletion capacitance lowers. If the depletion capacitance lowers, the internal potential of the pillar FIN is determined only by the difference in Fermi level between the material of the pillar and the material of the gate electrode G (a work function in a case where the gate electrode G is formed of metal). Therefore, if the pillar width $T_{FIN}$ decreases, the threshold voltage Vth no longer depends on the channel region concentration $N_{CH}$. The range of the pillar width $T_{FIN}$, with which the threshold voltage can be controlled by the channel region concentration $N_{CH}$, can be analytically found from equation (3). If it is necessary that the difference between φs and φo be 0.05V (1/20V) or more, which is nearly equal to a thermal potential, the range of the aforementioned formula (1) can be found immediately. According to formula (1), for example, the minimum tolerable value of the pillar width $T_{FIN}$ is about 0.04 μm when the channel region concentration $N_{CH}$ is $1 \times 10^{17}$ cm$^{-3}$, about 0.02 μm when the channel region concentration $N_{CH}$ is $5 \times 10^{17}$ cm$^{-3}$, and about 0.01 μm when the channel region concentration $N_{CH}$ is $1 \times 10^{18}$ cm$^{-3}$.

The formula (2) will now be explained referring to FIGS. 2A to 2D. FIGS. 2A to 2D show, by solid lines and broken lines, maximum tolerable values of the pillar width $T_{FIN}$ that are necessary to lower the off-leak current to $1 \times 10^{-16}$ ampere or less in specified conditions. FIGS. 2A to 2D are graphs plotting the gate length $L_G$ on the abscissa and the maximum tolerable width $T_{FIN-MAX}$ of the pillar on the ordinate in the respective conditions. The graphs show the maximum tolerable widths $T_{FIN-MAX}$ by discrete points, which were estimated based on current/voltage characteristics calculated by simulation using a device simulator. It should be noted, however, that the off-leak current was calculated as a drain current in the case where the operation temperature is 85° C. and the gate voltage is 0V.

Solid lines 21a, 21b, 21c and 21d in FIGS. 2A to 2D indicate the case where the impurity concentration $N_{SD}$ of the source/drain region is $2 \times 10^{18}$ cm$^{-3}$, and broken lines 22a, 22b, 22c and 22d indicate the case where the impurity concentration $N_{SD}$ of the source/drain region is $1 \times 10^{19}$ cm$^{-3}$.

Figure 2A:
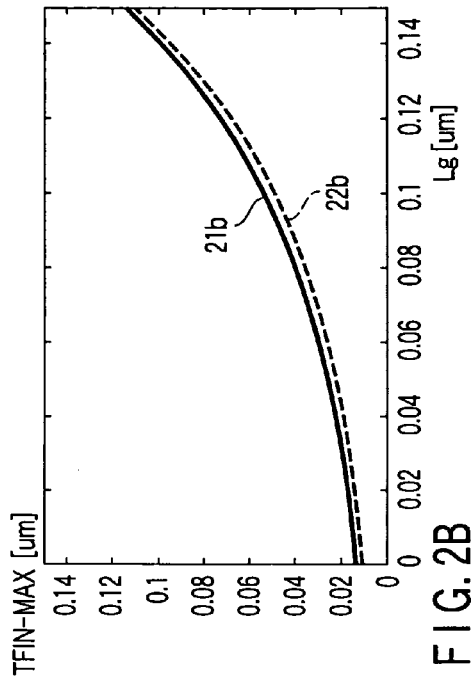
FIGS. 2A to 2D are graphs showing maximum tolerable widths $T_{FIN-MAX}$ of pillar width $T_{FIN}$ according to the embodiment.

FIG. 2A is a graph showing the solid line 21a and broken line 22a. FIG. 2A indicates the maximum tolerable width $T_{FIN-MAX}$ of the pillar width $T_{FIN}$ when the gate insulating film thickness $T_{OX}$ is 0.003 μm and the concentration $N_{CH}$ of the channel region is $7 \times 10^{16}$ cm$^{-3}$.

Figure 2B:
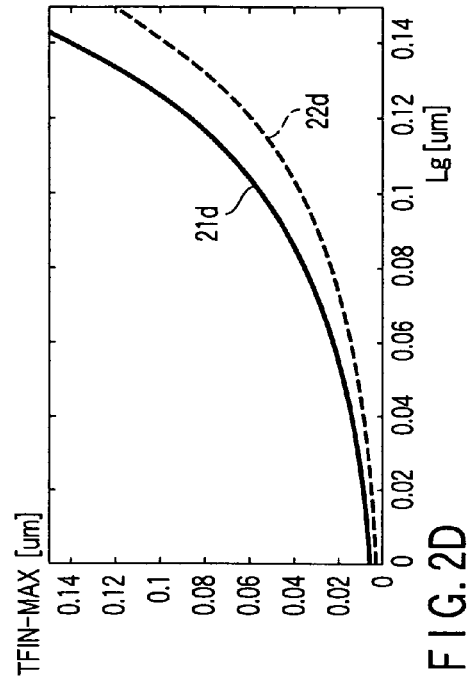

FIG. 2B is a graph showing the solid line 21b and broken line 22b. FIG. 2B indicates the maximum tolerable width $T_{FIN-MAX}$ of the pillar width $T_{FIN}$ when the gate insulating film thickness $T_{OX}$ is 0.003 μm and the concentration $N_{CH}$ of the channel region is $1 \times 10^{17}$ cm$^{-3}$.

Figure 2C:
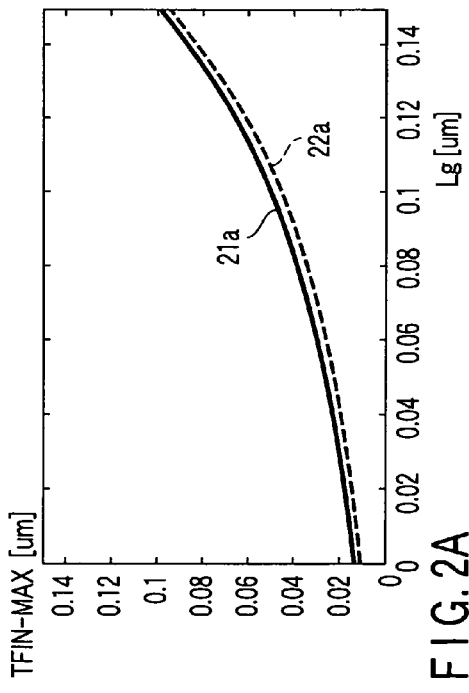

FIG. 2C is a graph showing the solid line 21c and broken line 22c. FIG. 2C indicates the maximum tolerable width $T_{FIN-MAX}$ of the pillar width $T_{FIN}$ when the gate insulating film thickness $T_{OX}$ is 0.003 μm and the concentration $N_{CH}$ of the channel region is $2\times10^{17}$ cm$^{-3}$.

Figure 2D:
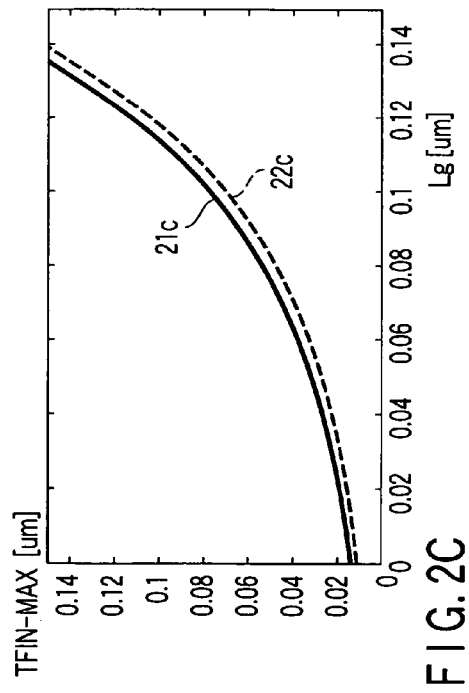

FIG. 2D is a graph showing the solid line 21d and broken line 22d. FIG. 2D indicates the maximum tolerable width $T_{FIN-MAX}$ of the pillar width $T_{FIN}$ when the gate insulating film thickness $T_{OX}$ is 0.008 μm and the concentration $N_{CH}$ of the channel region is $2\times10^{17}$ cm$^{-3}$.

As is shown in FIGS. 2A to 2D, it is understood that the result of the device simulation is very similar to the result of formula (2) when the gate length $L_G$ is 0.15 μm or less, the gate insulating film thickness $T_{OX}$ is 0.008 μm or less, the channel concentration $N_{CH}$ is $5\times10^{17}$ cm$^{-3}$, and the concentration $N_{SD}$ of the source/drain region is $1\times10^{19}$ cm$^{-3}$.

It is expected, in practice, that the pillar width $T_{FIN}$ is made less than the maximum tolerable value in order to suppress a variance in manufacturing steps. Thus, it is possible to set the maximum tolerable width $T_{FIN-MIN}$ of the pillar width $T_{FIN}$ below the above range.

In formula (2), if the channel region concentration $N_{CH}$ is set at a maximum value ($5\times10^{17}$ cm$^{-3}$) and the source/drain region concentration $N_{SD}$ is set at a minimum value ($1\times10^{18}$ cm$^{-3}$), the following formula (4) is obtained.

$$T_{FIN} \leq a'(T_{OX}) \times \exp(b'(T_{OX}) \times L_G) \quad (4)$$

where $a'(T_{OX}) = 0.0149 \times (1 - 88.4 \times T_{OX})$, and $b'(T_{OX}) = 26.3 \times (1 - 36.2 \times T_{OX})$.

In short, the formula (4) represents the maximum tolerable range of the pillar width $T_{FIN}$ specified by only the gate length $L_G$ and gate insulating film thickness $T_{OX}$. Formula (4) may be substituted for formula (2).

As has been described above, if the pillar width $T_{FIN}$ is chosen within the range specified by formulae (1) and (2) or formulae (1) and (4), the controllability of the threshold voltage in the fin-type transistor can be maintained and at the same time the off-leak current can be suppressed to $1\times10^{-16}$ ampere or less. Thereby, the miniaturization of the device can be achieved without changing the gate material, and the cost necessary for the design and manufacture of the device can be reduced. Moreover, the off-leak current can be suppressed to $1\times10^{-16}$ ampere or less. By using the fin-type transistor of this invention for a DRAM cell, a cell with good voltage-retention characteristics of the storage electrode can be realized with a small area.

Furthermore, as shown in FIGS. 2A to 2D, the gate length $L_G$ can be reduced to 0.1 μm or less, while the above advantage is being maintained. Thus, the integration density can be increased by reducing the size of the device.

The present invention is not limited to the fin-type transistor shown in FIG. 1. Alternatively, the following structure may be adopted. The gate electrode G may be projected below the upper surface of the device isolation insulating film 36. This structure is advantageous in suppressing the punch-through under the channel region. The width of projection is made substantially equal to the width of the depletion layer spreading under the source/drain region. For example, the source region S and drain region D may be set off relative to the gate electrode G. With this structure, the gate length is substantially increased and the off-leak current is decreased. This is realized by processing the gate electrode G, depositing an insulating film thereon, removing a surface portion thereof, forming a separation layer (off-set spacer), and then performing ion implantation. For example, the N-type regions of the source region S and drain region D on both sides of the pillar FIN may be prevented from contacting within the pillar FIN. Since the depletion layer of the drain does not easily spread in the central part of the pillar FIN, the off-leak current decreases. To achieve this, it should suffice if ion implantation is performed with a low acceleration energy of 1 KeV or less. For example, in order to prevent the increase in resistance value of the source region S and drain region D, surface portions of the source region S and drain region D may be salicided. For example, the pillar width $T_{FIN}$ may be increased by a degree corresponding to the source region S and drain region D.

[Second Embodiment]

A trench type DRAM, to which the fin-type transistor according to the first embodiment is applied, will now be described with reference to FIGS. 3 to 6.

Figure 3:
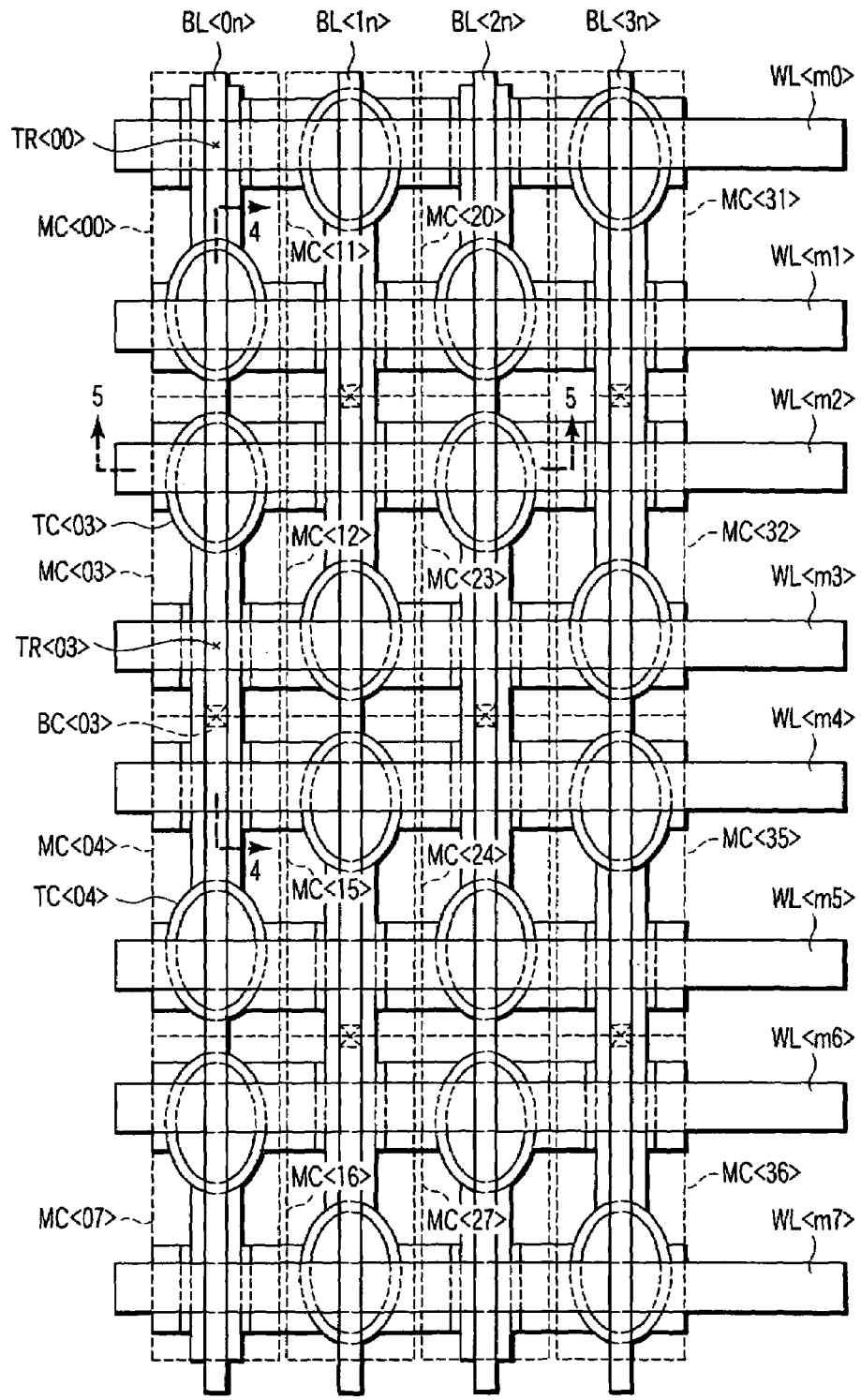
FIG. 3 is a view for describing a semiconductor device according to an embodiment of the invention, FIG. 3 being a plan view schematically showing a memory cell array of DRAM cells to which fin-gate type double-gate transistors are applied.
Figure 4:
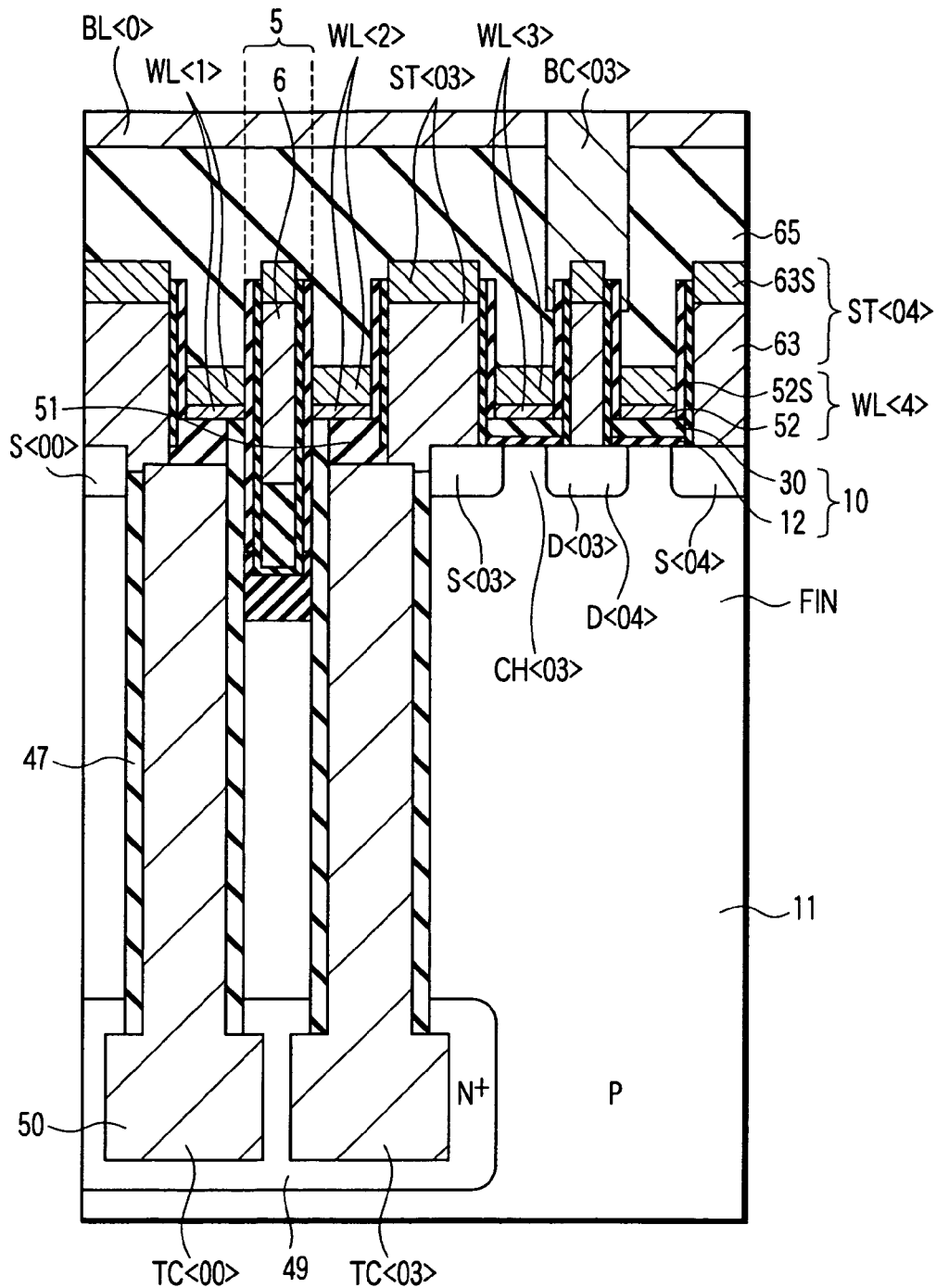
FIG. 4 is a view for describing the semiconductor device according to the embodiment of the invention, FIG. 4 being a cross-sectional view taken along line 4—4 in FIG. 3.
Figure 6:
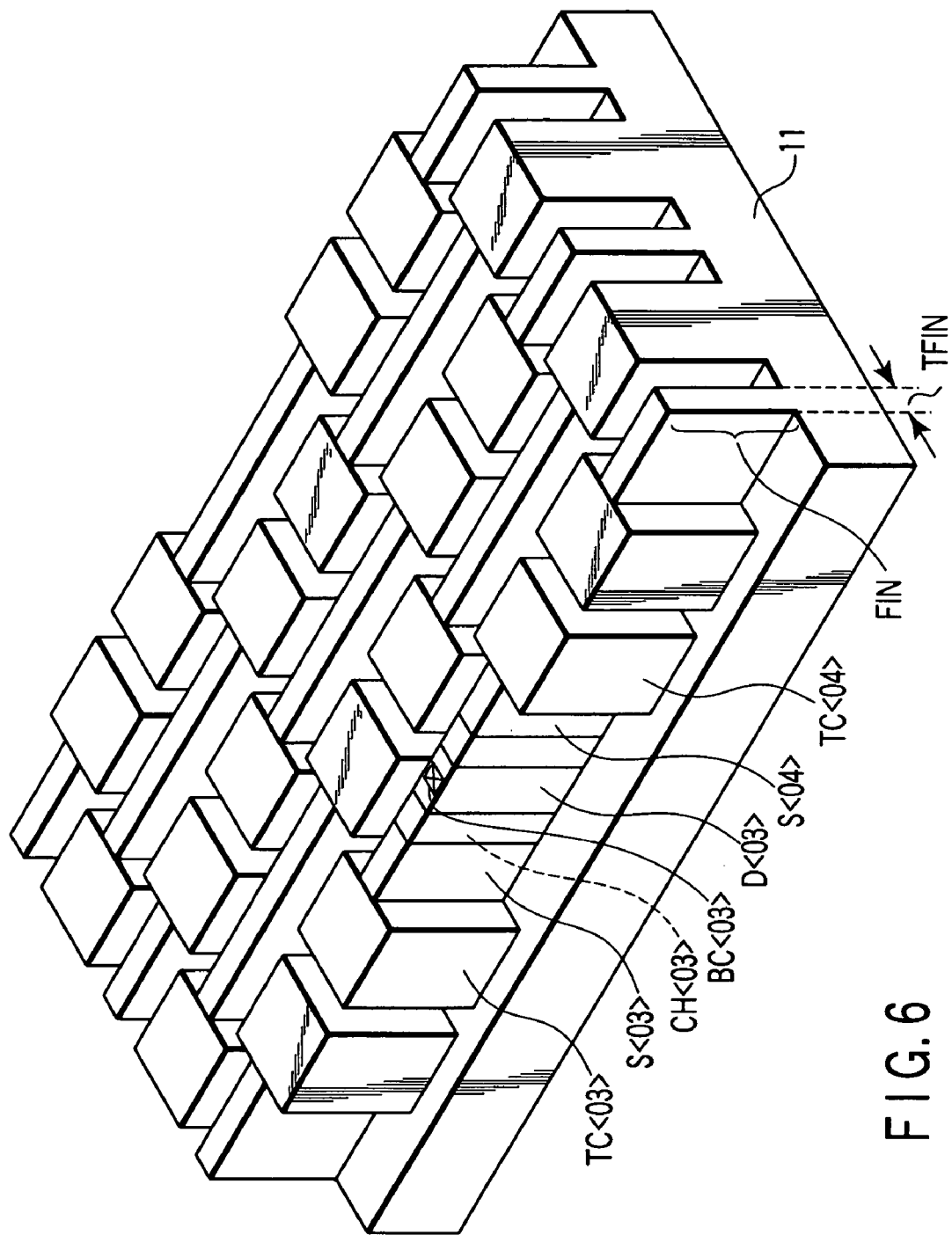
FIG. 6 is a view for describing the semiconductor device according to the embodiment of the invention, FIG. 6 being a perspective view schematically showing a main part of the memory cell array.

FIGS. 3 to 6 are views for describing the semiconductor device and the dynamic semiconductor memory device according to the embodiment of the invention. FIGS. 3 to 6 show a DRAM by way of example. FIG. 3 is a plan view schematically showing a memory cell array of DRAM cells to which the fin-type transistors and trench capacitors are applied. FIG. 4 is a cross-sectional view taken along line 4—4 in FIG. 3. FIG. 5 is a cross-sectional view taken along line 5—5 in FIG. 3. FIG. 6 is a perspective view schematically showing a main part of the memory cell array shown in FIG. 3.

In the Figures, <nm> (m, n=a positive integer) corresponds to <column & row> in each memory cell.

An example of the pattern of the memory cell array will now be described with reference to FIG. 3. MC<00> to MC<36> indicated by broken lines are 1-bit memory cells. The memory cells MC (MC<00> to MC<36>) are provided at intersections between bit lines BL (BL<0> to BL<3>) and word lines WL (WL<0> to WL<7>).

Each memory cell MC comprises a fin-gate type double-gate transistor TR (TR<00> to TR<36>) and a trench capacitor TC (TC<00> to TC<36>). A source region S of each transistor TR is connected to one of the electrodes of the trench capacitor TC, and a drain region thereof is commonly connected to a drain region of the transistor TR in the adjacent memory cell MC, whereby a pair of memory cells MC are formed. The drain region of each transistor TR is connected to a bit line BL via a bit line contact (connection portion) BC. The paired memory cells MC are arranged such that the transistor TR and trench capacitor TC are alternately disposed along the associated word line WL. For example, if attention is paid to the word line WL<m0>, the components are arranged in the following order: the transistor TR<00> of memory cell MC<00>, the trench capacitor TC<11> of memory cell MC<11>, the transistor TR<20> of memory cell MC<20>, and the trench capacitor TC<31> of memory cell MC<31>. In this manner, a pair of double-gate transistors and a pair of trench capacitors are alternately arranged in a staggered fashion. Thereby, the area occupied by the pattern can be reduced.

Next, the three-dimensional structure of the memory cell MC<03> and memory cell MC<04> in FIG. 3, for instance, will be described referring to the cross-sectional views of FIGS. 4 and 5 and the perspective view of FIG. 6.

A P-type silicon substrate 11 is provided with a projecting semiconductor region (also called "pillar", hereinafter referred to as "pillar") FIN. The pillar FIN is formed by processing a surface portion of the silicon substrate 11 in a projecting shape. The height of the pillar FIN is, e.g. 0.3 to 1.0 μm, but it may be less than 0.3 μm. A channel region CH<03> is formed on both side walls of the pillar FIN. Boron (B), for instance, is ion-implanted in the channel region CH<03> for adjusting the threshold voltage.

As is shown in FIG. 5, a gate insulating film $G_{OX}$<12> is formed on the surface of a channel region CH<12> (not shown). The thickness of the gate insulating film $G_{OX}$<12> is, e.g. 5 nm. In addition, as shown in FIG. 4, each source region S is connected to one of the electrodes (storage electrode 50) of the trench capacitor TC via a strap electrode ST. Each strap electrode ST has a stacked structure comprising a polysilicon layer 63 and a high-melting-point metal silicide layer 63S. For example, the strap electrode ST<03> of memory cell MC<03> is put in contact with parts of the upper surface and side wall of the source region S<03> formed on the side surface of the pillar FIN. Thus, the source region S<03> and the storage electrode 50 of trench capacitor TC<03> are electrically connected. Alternatively, the source region S<03> and strap electrode ST<03> may be connected such that only the upper surface or the side wall of the source region S<03> contacts the strap electrode ST<03>. The reason is that it should suffice if sufficient electrical connection is established between the source region S and strap electrode ST. The resistance value between the source region S and trench capacitor TC can be decreased by connecting the source region S and the storage electrode 50 of trench capacitor TC in this manner.

The trench capacitor TC comprises the storage electrode 50 and plate electrode 49, which are formed via a capacitor insulating film (not shown). The storage electrode 50 is formed of, e.g. polysilicon buried in a trench, and the plate electrode 49 is formed of, e.g. an $N^+$ type region that is formed by diffusing arsenic (As) in the substrate 11.

A word line WL is formed on the upper surface of the pillar FIN such that an insulating film 10 having a thickness of, e.g. about 0.1 $\mu$m or less, is interposed therebetween. For example, a word line (active word line) WL<3> is formed via the insulating film 10 formed on the channel region of the memory cell MC<03>. The active word line WL, in this example, is a word line for switching the transistor provided immediately below. The active word line WL comprises a polysilicon layer 52 and a high-melting-point metal silicide layer 52S. The insulating film 10 comprises, for example, a silicon oxide film 12 with a thickness of 0.002 $\mu$m and a silicon nitride film 30 with a thickness of 0.07 $\mu$m.

A buried insulating film 51 is formed on the upper surface of the trench capacitor TC. A collar insulating film 47 is formed along wall of the upper part of the trench capacitor TC. The thickness of the buried insulating film 51 is 0.03 $\mu$m or more, which is greater than the thickness of the gate insulating film $G_{OX}$. A word line (passing word line) WL of the adjacent memory cell is formed on each buried insulating film 51. For example, a passing word line WL<2> is formed on the buried insulating film 51 formed on the upper surface of the trench capacitor TC<03>. The passing word line WL merely passes over the trench capacitor TC<03> and has no switching function for the memory cell MC<03>. In this manner, the word lines WL are provided such that active word lines and passing word lines are alternately arranged.

An isolation portion 6 is formed at an upper part of a device isolation region 5 between the trench capacitors TC of memory cells MC formed along the bit line BL.

As is shown in FIG. 5, gate electrodes G of polysilicon are formed on both side walls of the pillar FIN so as to sandwich the pillar FIN via the gate insulating film $G_{OX}$. In addition, a word line WL comprising a polysilicon layer 52 and a silicided-polysilicon layer 52S is formed in contact with the upper surface of the gate electrode G. Furthermore, adjacent to the gate electrode G, trench capacitors TC are formed along the word line WL. As is shown in FIG. 5, for example, a trench capacitor TC<03> and a trench capacitor TC<23> are formed along the word line WL<2> adjacent to the gate electrode G<12>. A collar insulating film 47 is formed on an inner wall of the upper part of the trench capacitor TC. A buried insulating film 51 is formed on the upper surface of the trench capacitor TC. Furthermore, a word line WL is formed in contact with the collar insulating film 47 and buried insulating film 51. Accordingly, the gate electrode G is sandwiched between the gate insulating film $G_{OX}$ and collar insulating film 47. The thickness of the collar insulating film 47 is made greater than that of the gate insulating film $G_{OX}$.

As is shown in FIGS. 5 and 6, the pillar width $T_{FIN}$ of the channel region of the fin-type transistor with the above structure is determined to satisfy the aforementioned formulae (1) and (2) or formulae (1) and (4).

The pillar width $T_{FIN}$ is defined by the following formulae (1) and (2):

$$T_{FIN} \geq (\in/4qN_{CH})^{1/2} \quad (1)$$

$$T_{FIN} \leq a(T_{OX}, N_{CH}, N_{SD}) \times \exp(b(T_{OX}, N_{CH}, N_{SD}) \times L_G) \quad (2)$$

where $a(T_{OX}, N_{CH}, N_{SD}) = 0.0173 \times (1-76.3 \times T_{OX} - 2.43 \times 10^{-19} \times N_{CH} - 1.57 \times 10^{-20} \times N_{SD})$, and $b(T_{OX}, N_{CH}, N_{SD}) = 8.21 \times (1+116 \times T_{OX} + 4.38 \times 10^{-18} \times N_{CH} + 1.63 \times 10^{-20} \times N_{SD})$.

In formula (1), $N_{CH}$ is the impurity concentration in the channel region, $\in$ is the dielectric constant of material (silicon in this embodiment) of the pillar FIN, and q is the elementary charge. In formula (2), $T_{OX}$ is the thickness of the gate insulating film $G_{OX}$, $N_{SD}$ is the impurity concentration in the source region S/drain region D, and $L_G$ is the gate length.

The pillar width $T_{FIN}$ is defined by the following formulae (1) and (4). Formula (4) is as follows:

$$T_{FIN} \leq a'(T_{OX}) \times \exp(b'(T_{OX}) \times L_G) \quad (4)$$

where $a'(T_{OX}) = 0.0149 \times (1-88.4 \times T_{OX})$, and $b'(T_{OX}) = 26.3 \times (1-36.2 \times T_{OX})$.

An example of the basic operation of each memory cell MC will now be described, referring to the memory cell MC<03> by way of example. In the following description of the example of the basic operation, attention will be paid to the variation in voltage of the bit line BL<0> in the read/write operation mode.

To begin with, the data read-out operation will be described. The bit line BL<0> is selected and precharged. The bit line BL<0> is thus activated. The precharge level of the bit line BL<0> is set at ½ (VDD/2) of the power supply voltage VDD that drives the sense amplifier for sensing the signal from, e.g. the bit line BL<0>.

Then, the word line WL for data read-out is selected. A positive potential is applied to the selected word line WL from a word line driver in a row decoder (not shown). For example, if the word line WL<3> is selected, the transistors with gate electrodes connected to the word line WL<3> are turned on. In FIG. 4, the gate electrode G<3> connected to the word line WL<3> is selected, and the transistor TR<03> is turned on.

Thereby, the bit line BL<0> at the precharge level is electrically connected to the storage electrode 50 of trench capacitor TC<03> of memory cell MC<03>.

At this time, if charge is accumulated in the trench capacitor TC<03> of memory cell MC<03>, charge is released to the bit line BL<0> from the trench capacitor TC<03> of memory cell MC<03>. As a result, the potential of the bit line BL<0> becomes higher than that of other bit lines set at the precharge level (VDD/2). On the other hand, if no charge is accumulated in the trench capacitor TC<03>, charge is supplied from the bit line BL<0> to the trench capacitor TC<03> and is released. Thereby, the potential of the bit line BL<0> becomes lower than that of other bit lines set at the precharge level (VDD/2). The potential difference is sensed and amplified by the sense amplifier connected thereto, whereby "1" data or "0" data is read out. In this case, in accordance with the read-out "1" data or "0" data, "1" data or "0" data is rewritten in the trench capacitor TC<03> of memory cell MC<03> ("data refresh").

Next, the data write operation will be described. To start with, a VDD level or 0V is applied from the sense amplifier to the bit line BL<0> in accordance with write data "1" or "0". If the word line WL<3> is selected, the transistor TR<03> is turned on and the bit line BL<0> is electrically connected to the storage electrode 50 of trench capacitor TC<03>.

Charge is accumulated in the trench capacitor TC<03> from the bit line BL<03> via the transistor TR<03>, or charge is released from the trench capacitor TC<03>. Thus, the write operation is performed.

The same operation is performed for other memory cells MC.

According to the above structure, the following advantages can be obtained.

Since the buried insulating film 51 is thicker than the gate insulating film $G_{OX}$, the possibility of malfunction can be lowered and the reliability is enhanced.

As has been described above, when the read/write operation is performed, current is let to flow to the bit line BL and word line WL, and the potential of the bit line BL is detected. The potential of the bit line BL varies depending on whether the charge is accumulated in the trench capacitor TC or released therefrom.

However, in the present embodiment, as described above, the buried insulating film 51 completely covers the upper surface of the trench capacitor TC and has a thickness enough to achieve electrical insulation. For example, in FIG. 5, electrical insulation between the word line WL<2> and the trench capacitor TC<03>, TC<23> can sufficiently be maintained.

The gate electrode G is sandwiched between the gate insulating film $G_{OX}$ and the thick collar insulating film 47. Thus, malfunction of, for example, the trench capacitors TC<03> and TC<23> that are adjacent as shown in FIG. 5, can be prevented. In other words, when a switching operation is performed by the gate electrodes formed on both side walls of the pillar FIN, if electrical insulation between the adjacent trench capacitors is not sufficient, malfunction may be caused due to similar operations. However, the thick collar insulating film 47 ensures sufficient insulation.

Since the source region and trench capacitor TC are connected via the strap electrode ST, the resistance value between the source region S and trench capacitor TC can be reduced.

Since each of the word line WL, strap electrode ST and bit line contact BC has the double-layer structure comprising the polysilicon layer and high-melting-point metal silicide layer, the silicide layer can reduce the resistance value.

The pillar width $T_{FIN}$ of the channel region of the fin-type transistor is determined to satisfy the aforementioned formulae (1) and (2) or formulae (1) and (4). It is thus possible to provide a DRAM memory cell having an off-leak current of $1 \times 10^{-16}$ ampere or less and a gate length of 0.1 μm or less. Since the off-leak current is $1 \times 10^{-16}$ ampere or less, the voltage retention characteristics of the storage electrode 50 can be enhanced. Moreover, since the voltage retention characteristics of the storage electrode 50 are enhanced, the capacitor area can be reduced. Furthermore, since the gate length can be reduced to 0.1 μm or less, the cell area can be reduced. With the above advantages, the array area can greatly be reduced. Therefore, very remarkable advantages can be obtained if the present invention is applied to the DRAM memory cell, as in this embodiment.

A method of fabricating the semiconductor device according to the embodiment of the invention will now be described. Specifically, a method of fabricating the memory cell having the fin-gate type double-gate transistor and trench capacitor shown in FIGS. 3 to 6 will be described by way of example. In this example, the memory cell array and its peripheral circuit, or a logic circuit or an arithmetic circuit different from the memory, are fabricated through a series of steps.

FIGS. 7A to 29A are cross-sectional views taken along line 4—4 in FIG. 3, illustrating manufacturing steps in succession. FIGS. 7B to 29B are cross-sectional views taken along line 5—5 in FIG. 3, illustrating manufacturing steps in succession. FIGS. 7C to 29C are cross-sectional views illustrating manufacturing steps in succession of a peripheral circuit, such as an address buffer, a decoder, a sense amplifier or an input/output buffer, which is provided in the vicinity of the memory cell array (or a logic circuit or an arithmetic circuit different from the memory).

Figure 7A:
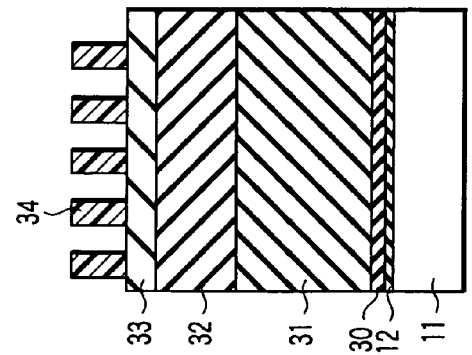
Figure 7B:
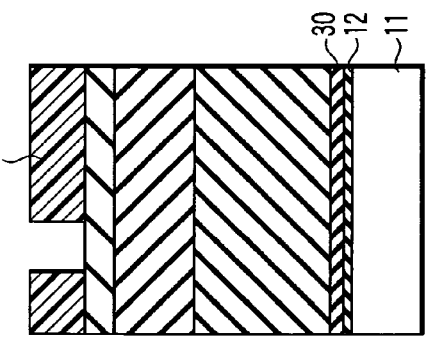

To start with, a silicon oxide film 12 with a thickness of about 2 nm is formed by, e.g. thermal oxidation, on a major surface of a P-type silicon substrate 11. The silicon oxide film 12 may be an oxide film formed by a chemical process with a different composition. A silicon nitride film 30 with a thickness of, e.g. 70 nm is deposited on the silicon oxide film 12. A TEOS-SiO$_2$ film 31 with a thickness of, e.g. about 550 nm, is formed on the silicon nitride film 30 by CVD (Chemical Vapor Deposition) using TEOS (Tetra Ethyl Ortho Silicate) as a reaction gas. A hard mask film 32 with a thickness of, e.g. 300 nm, which is comprised essentially of an insulating film, is formed on the TEOS-SiO$_2$ film 31. An SOG (Spin on Glass) film 33 with a thickness of, e.g. 10 nm, is deposited on the hard mask film 32. The hard mask film 32 and SOG film 33 serve to exactly form a trench in the TEOS-SiO$_2$ film 31, as will be described later. A photoresist 34 is coated on the SOG film 33, and is subjected to exposure and development. Thus, the photoresist 34 is patterned to form a device isolation region (STI: Shallow Trench Isolation). The width of the device isolation region is, e.g. about 90 nm to 110 nm, and the device isolation regions are arranged at intervals of 90 nm to 100 nm (FIGS. 7A and 7B).

Figure 7C:
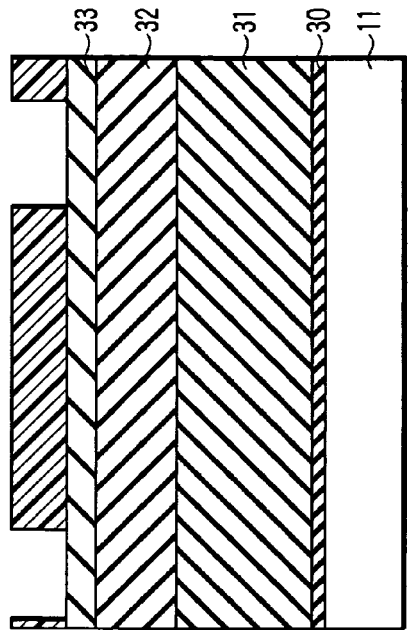

The peripheral circuit is formed through the same steps as the memory cell array. A silicon nitride film 30, a TEOS-SiO$_2$ film 31 and an SOG film 33 are successively deposited on the silicon substrate 11. A photoresist 34 is coated on the SOG film 33, and the photoresist 34 is patterned (FIG. 7C).

Figure 8A:
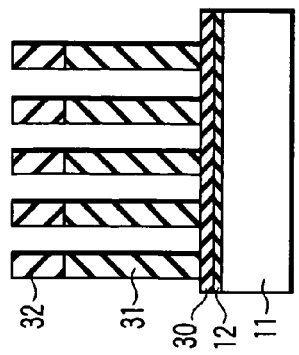
Figure 8B:
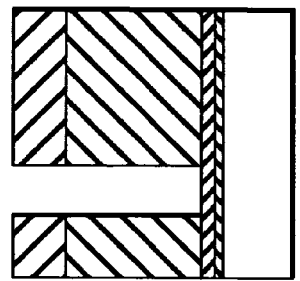
Figure 8C:
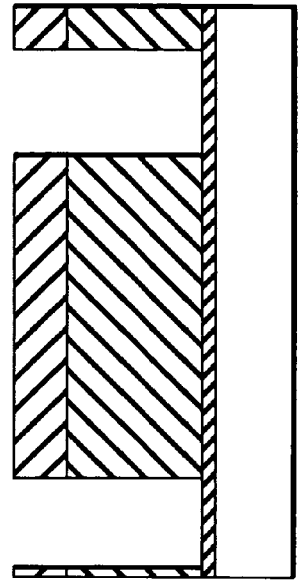

Using the photoresist 34 as a mask, the SOG film 33, hard mask film 32 and TEOS-SiO$_2$ film 31 are etched by, e.g. RIE (Reactive Ion Etching). Then, the SOG film 33 and photoresist 34 are removed (FIGS. 8A to 8C).

Then, using the remaining hard mask film 32 and TEOS-SiO$_2$ film 31 as a mask, a trench 35 with a width $T_{FIN}$ and a depth of about 250 nm is formed by, e.g. RIE, in the silicon nitride film 30, silicon oxide film 12 and silicon substrate 11. Through the steps of forming the trench 35, a projecting semiconductor region, which will become, e.g. a pillar FIN<12> of memory cell MC<12>, is formed on the major surface of silicon substrate 11. In this case, the width $T_{FIN}$ of the projecting semiconductor region is determined so as to satisfy the aforementioned formulae (1) and (2) or formulae (1) and (4) (FIGS. 9A and 9B).

As regards the peripheral circuit, a trench is formed by, e.g. RIE, in STI region formation portions of the silicon nitride film 30 and silicon substrate 11 through the same steps at the same time (FIG. 9C).

An oxide film (not shown) is formed by, e.g. thermal oxidation, on an inner wall of the trench. Further, SiO$_2$ is buried by, e.g. CVD, and then the surface is flattened by CMP (Chemical Mechanical Polishing). Through the above steps, an STI region 36 is formed in the trench 35 (FIGS. 10A and 10B).

As regards the peripheral circuit, an STI region 36 is formed in the trench by the same steps (FIG. 10C).

In the above steps up to the formation of the STI regions 36 of the memory cell array and peripheral circuit, the masks can be shared. Compared to the case where the STI region 36 is independently formed for the memory cell array and peripheral circuit, the manufacturing steps can be simplified and the manufacturing cost can be reduced.

Next, the peripheral circuit is masked and the STI region 36 of the memory cell array is etched back by, e.g. wet etching, by a depth of about 150 nm. At this time, the thickness of the STI region 36 left on the bottom of the trench is about 30 nm (FIGS. 11A to 11C).

Thereafter, by means of, e.g. ion implantation, phosphorus (P) is implanted twice in different oblique directions in the side walls of the silicon substrate 11 at the upper part of the STI region in the memory cell array. This implantation step can be carried out before recessing the STI region 36. In such a case, ions are vertically implanted, and then a gate insulating film G$_{OX}$ with a thickness of about 5 nm is formed by, e.g. thermal oxidation (not shown). Further, the resultant is nitrided in a nitrogen atmosphere or a plasma atmosphere and then annealed. Thereafter, a polysilicon layer 38, which will become the gate electrode, is deposited (FIGS. 12A to 12C).

Figure 13C:
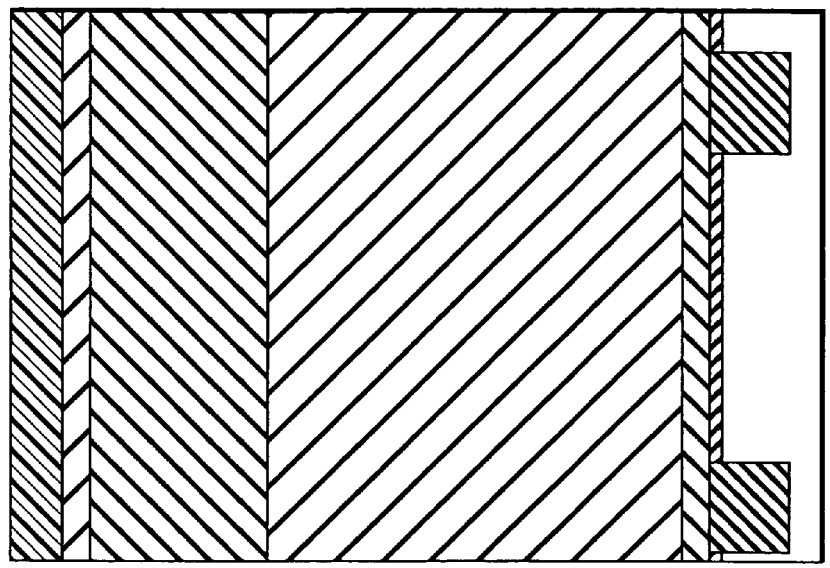
Figure 13B:
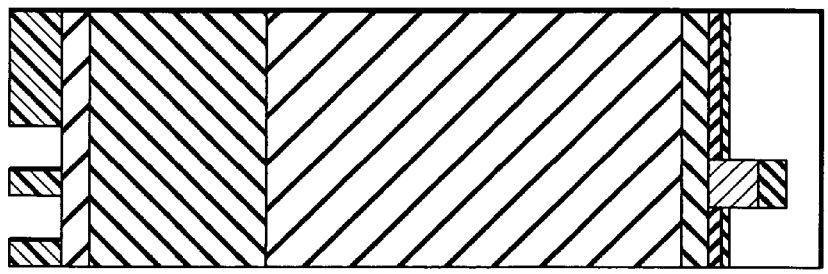
Figure 13A:
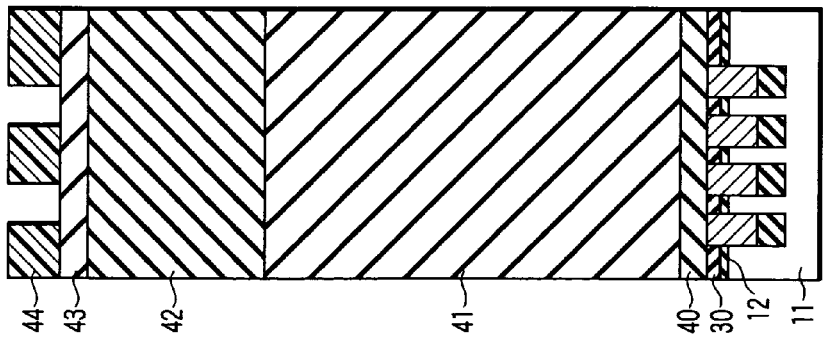

Subsequently, an oxide film is deposited on the entire surface of the substrate 11, for example, in a low-pressure atmosphere in which O$_2$ and H$_2$ are burnt, or in an ozone-containing atmosphere (not shown). Further, a silicon nitride film 40 with a thickness of about 100 nm, a BSG film 41 with a thickness of about 1600 nm serving as a mask material, a hard mask film 42 with a thickness of about 700 nm and an SOG film 43 with a thickness of about 10 nm are deposited in succession. A photoresist 44 is coated on the SOG film 43, and the photoresist 44 is subjected to exposure and development. Thus, a mask patterning for forming a deep trench is formed. The hard mask film 42 and SOG film 43 are deposited in order to exactly etch the BSG film 41 (FIGS. 13A to 13C).

Figure 14A:
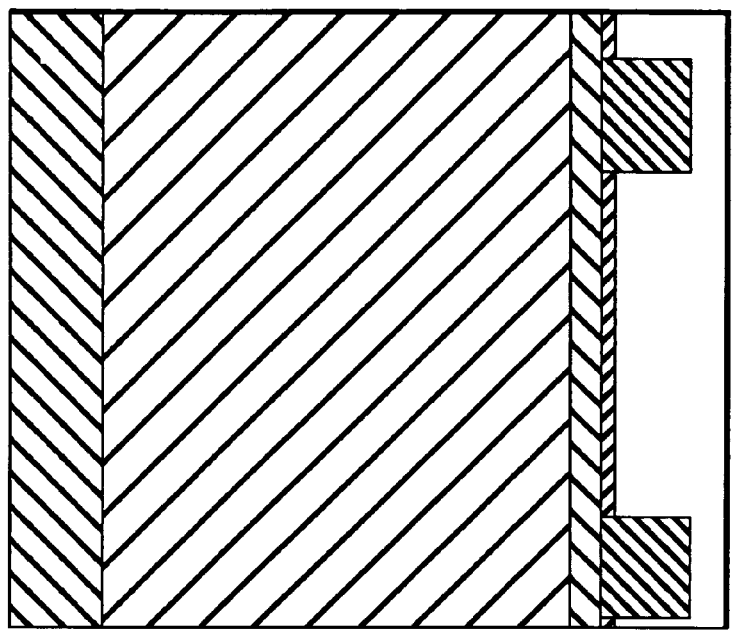
Figure 14B:
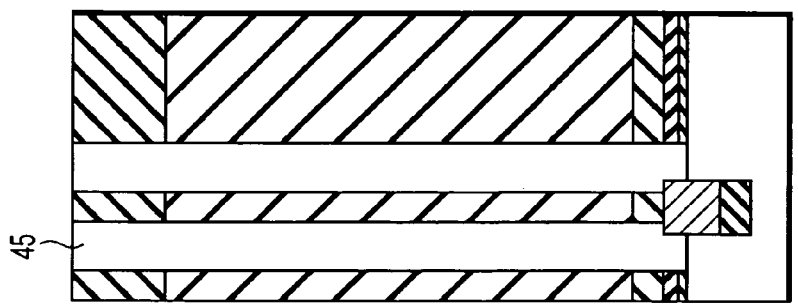
Figure 14C:
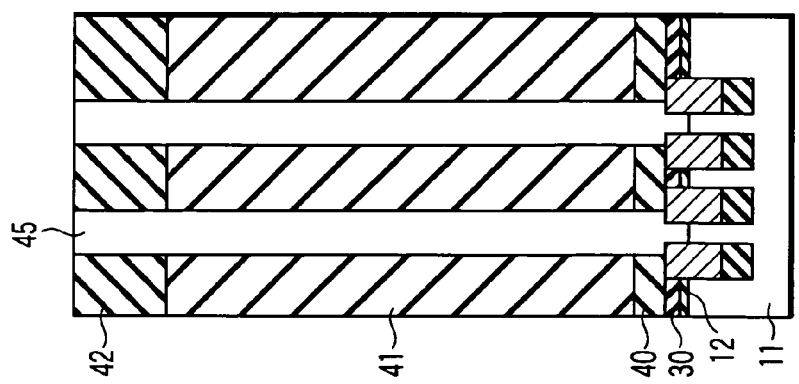

Using the photoresist 44 as a mask, the SOG film 43, hard mask film 42, BSG film 41, silicon nitride film 40, silicon nitride film 30 and silicon oxide film 12 are successively etched by, e.g. RIE. Thereby, a trench 45 serving as a mask for forming the deep trench is formed. The photoresist 44 and SOG film 43 are removed. In this step, by virtue of an oxide film (not shown) formed between the silicon nitride 30 and the silicon nitride film, only the silicon nitride film 40 can be selectively removed (FIGS. 14A to 14C).

Figure 15A:
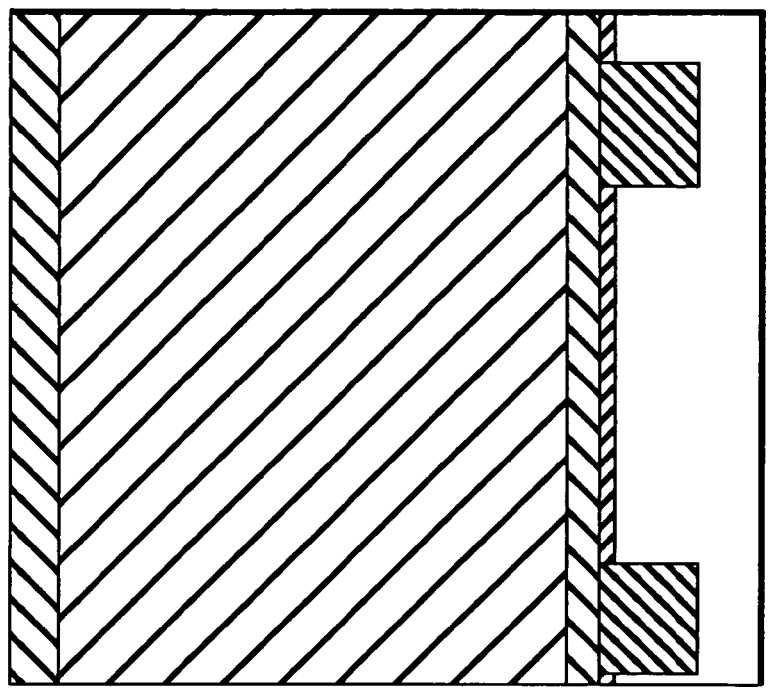
Figure 15B:
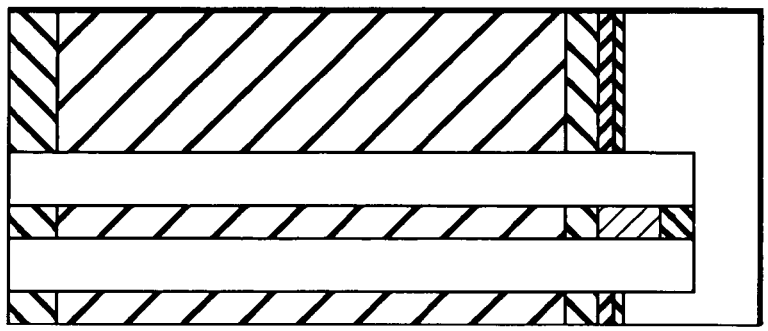
Figure 15C:
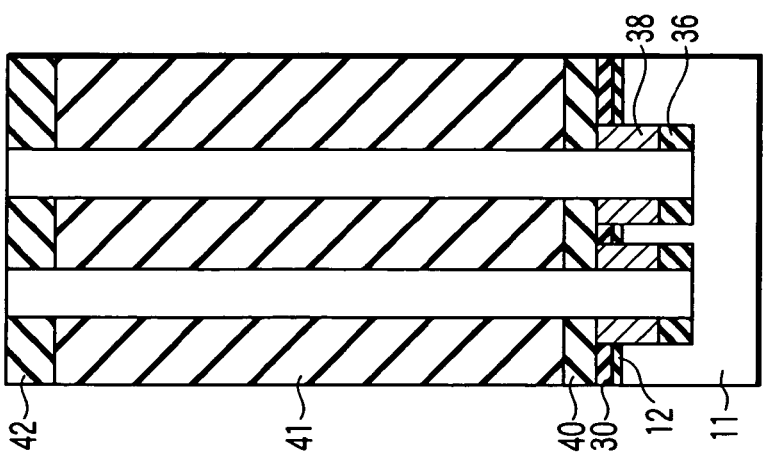

Then, the polysilicon layer 38 and STI region 36 are etched by, e.g. a low-selection-ratio etching method (FIGS. 15A to 15C).

Subsequently, the silicon substrate 11 is etched by, e.g. RIE, and a deep trench 46 with a depth of, e.g. about 6 $\mu$m is formed. Thereafter, post-cleaning is performed (FIGS. 16A to 16C).

Figure 17A:
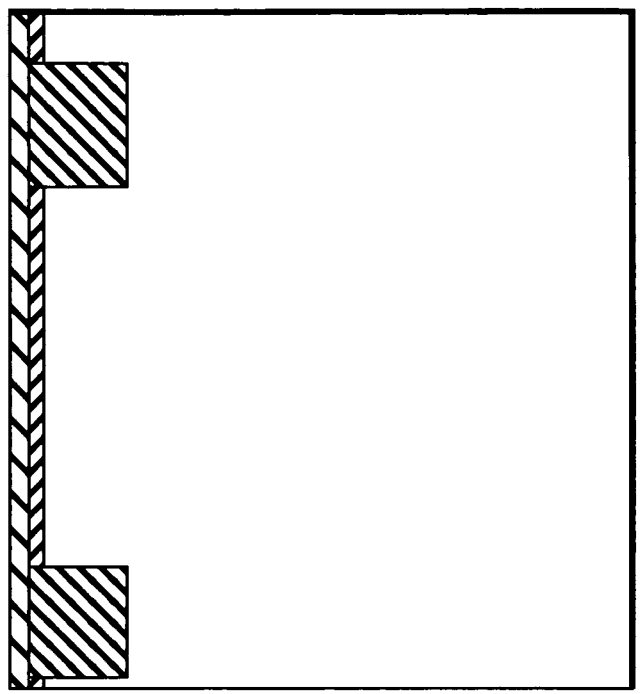
Figure 17B:
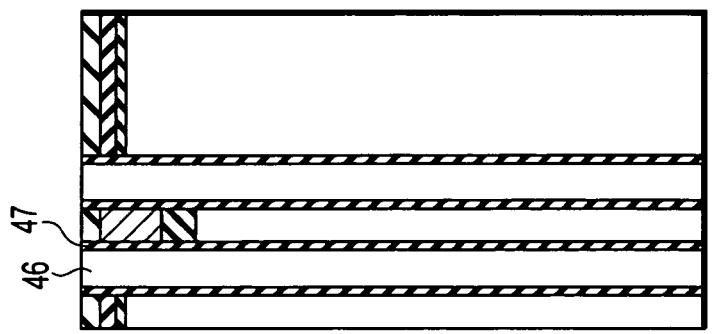
Figure 17C:
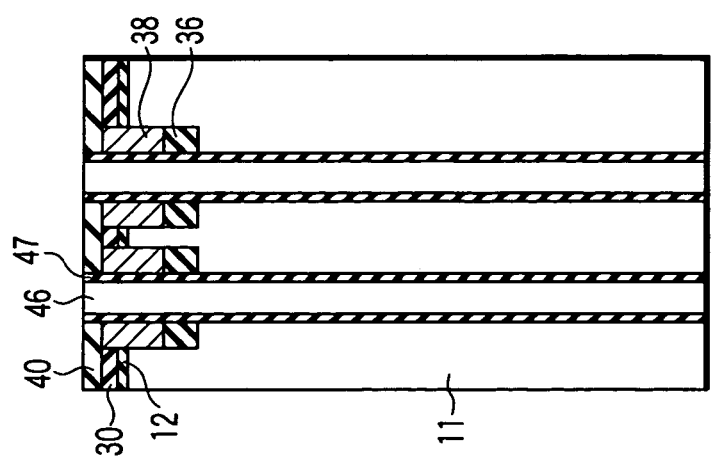

Following the above, the hard mask film 42 and BSG film 41 are removed. Further, the polysilicon layer 38 is entirely oxidized (not shown). The silicon substrate 11 is then subjected to thermal oxidation at, e.g. about 1100° C., and an oxide film (not shown) is formed within the trench 46. In addition, a silicon nitride film (not shown) is formed in the trench 46, and the silicon nitride film at the upper part of the trench 46 is removed. Then, again, a collar insulating film 47 is selectively formed by, e.g. thermal oxidation, on only that part where the silicon nitride film has been removed. The final thickness of the collar insulating film 47 is, e.g. about 25 nm to 30 nm. Through this step, the thickness of the collar insulating film 47 can desirably be controlled (FIGS. 17A to 17C).

A bottom portion 48 of the deep trench 46 is etched by about 30 nm by, e.g. chemical dry etching, and thus enlarged. Further, arsenic (As) or phosphorus (P) is adsorbed or diffused in the deep trench 46 by a gas-phase reaction, and an N$^+$ diffusion region 49 (plate electrode) is formed in the silicon substrate 11. Subsequently, a capacitor insulating film (not shown) is formed along the inner wall of the bottom portion 48 of the deep trench 46, and a polysilicon layer (storage electrode) 50 is buried in the deep trench 46. Thereafter, the top surface is flattened by, e.g. CMP (FIGS. 18A to 18C).

Figure 19C:
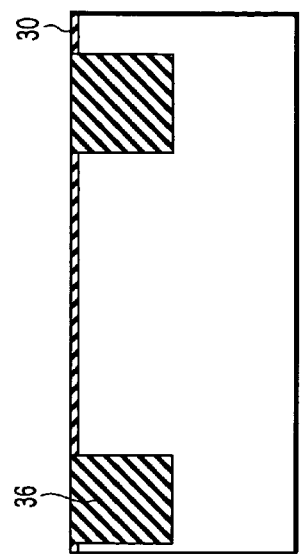
Figure 19B:
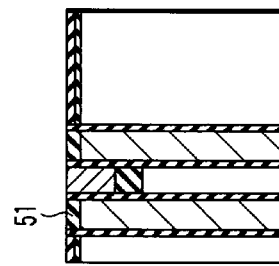
Figure 19A:
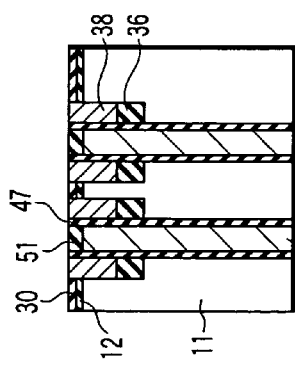

Next, the polysilicon layer 50 is etched back by about 50 nm by, e.g. a wet etching method. In the etched-back recess, a buried insulating film 51 of TEOS-SiO$_2$ is deposited by 200 nm by CVD using, e.g. TEOS as a reaction gas. Then, part of the buried insulating film 51 and silicon nitride film 40 are removed by, e.g. CMP, and the surface of the resultant structure is polished until the upper surface of the polysilicon layer 38 will be exposed (FIGS. 19A to 19C).

Figure 20C:
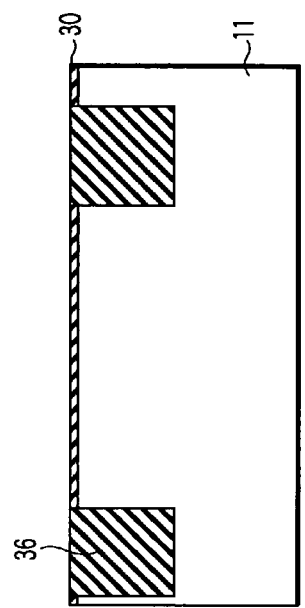
Figure 20B:
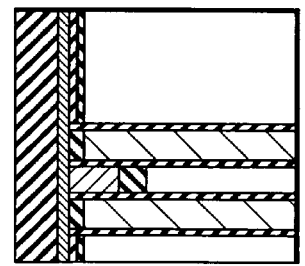
Figure 20A:
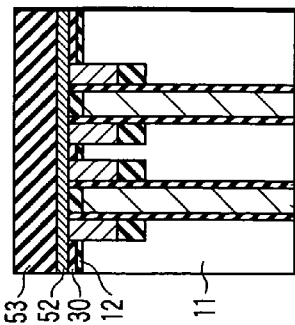

An undoped polysilicon layer 52 with a thickness of about 70 nm is deposited over the entire surface. Boron (B), for instance, is doped in the polysilicon layer 52 by ion implantation under conditions of 5 keV with 2×10$^{15}$/cm$^3$. Further, a BSG film 53 with a thickness of about 150 nm serving as a cap layer is deposited on the polysilicon layer 52. Then, only the area of the memory cell area is masked (FIGS. 20A and 20B).

The polysilicon layer 52 and BSG film 53 in the peripheral circuit region are removed by etching. Channel ion implantation is performed to form a channel region (not shown). In this case, the implanted impurities are thermally spread by annealing (FIG. 20C)

Figure 21C:
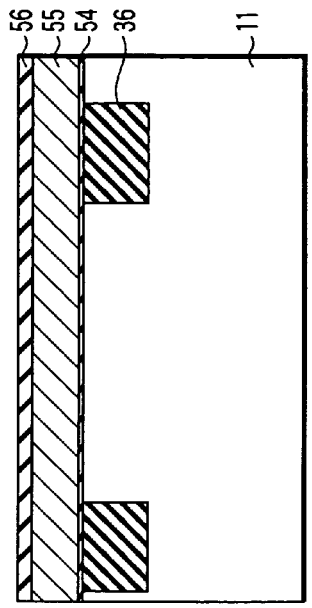
Figure 21B:
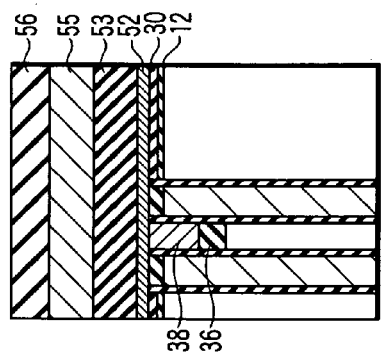
Figure 21A:
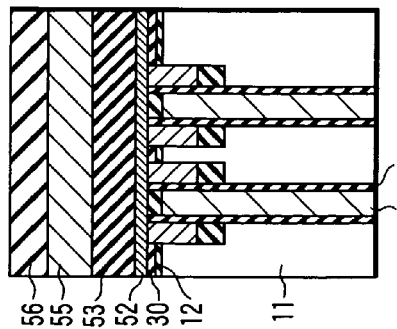

The surface of the substrate 11 is then thermally oxidized to form a gate insulating film 54 (not shown in FIGS. 21A and 21B). A polysilicon layer 55 with a thickness of about 200 nm, which becomes a gate electrode of the peripheral circuit, is formed on the gate insulating film 54. A BSG film 56 with a thickness of about 100 nm, which becomes a cap material, is formed on the polysilicon layer 55 (FIGS. 21A to 21C).

Figure 22C:
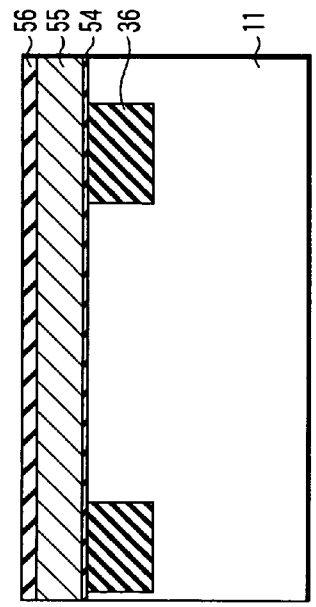
Figure 22B:
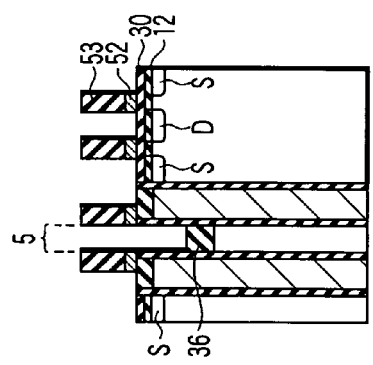

After the polysilicon layer 55 and BSG film 56 of the memory cell array are removed, an upper part of the gate electrode of the transistor in the memory cell and the word line WL are formed. In this case, a photoresist is first coated on the BSG film 56, and the photoresist is subjected to exposure and development to form a desired pattern. Using the photoresist as a mask, the polysilicon layer 52, BSG film 53 and polysilicon layer 38 are etched by, e.g. RIE. The device isolation region 5, from which the polysilicon layer 38 has been removed, functions to separate the trench capacitors TC that are adjacent along the bit line BL. Specifically, as shown in FIG. 22B, the device isolation region 5 is a device isolation region between the trench capacitor TC<00> and trench capacitor TC<03>. At this time, in the manufacturing step of this embodiment, the regions that become the gate electrode, bit line contact BC and device isolation region 5 are formed at a time. Since line-and-space photoresist patterns can be used, the manufacturing cost can be reduced and a higher integration density can be achieved.

Figure 22A:
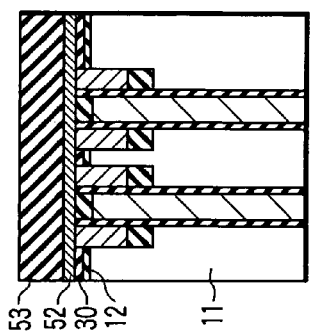

Thereafter, impurity ions of a conductivity type opposite to the conductivity type of the silicon substrate 11, e.g. phosphorus (P) or arsenic (As), are ion-implanted and diffused by annealing. Thus, the source region S and drain region D of the transistor TR are formed (FIGS. 22A to 22C).

Figure 23A:
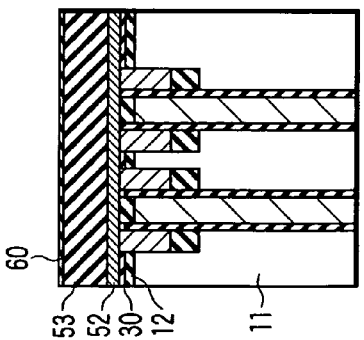
Figure 23B:
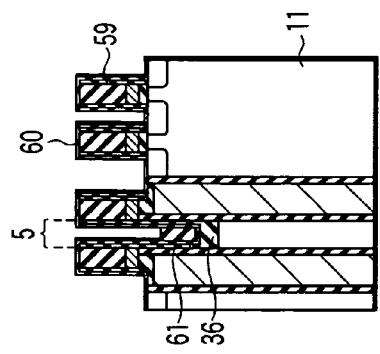

A silicon nitride film 59 that becomes a spacer is deposited on the entire surface, and it is etched by, e.g. RIE. As a result, there remain only the polysilicon layer 55, which is to become the gate electrode of transistor TR, the spacer silicon nitride film 59 lying on the side wall of the BSG film 56, and the underlying silicon nitride film 30. Further, a barrier silicon nitride film 60 is deposited on the entire surface. A BPSG film 61 is deposited on the device isolation region 5 between the trench capacitors TC that are adjacent along the bit line BL (FIGS. 23A and 23B).

Figure 23C:
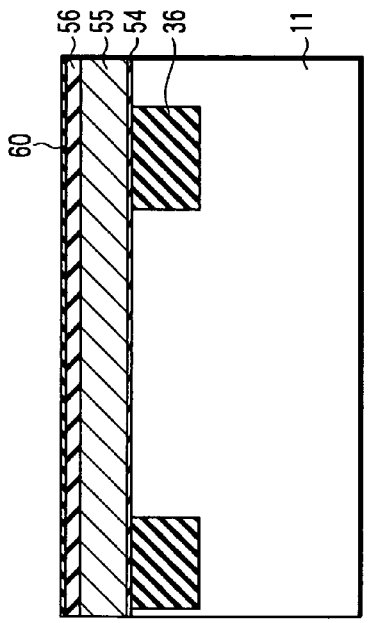

Similar steps are performed for the peripheral circuit. As a result, only the barrier silicon nitride film 60 is left on the BSG film 56 (FIG. 23C).

Figure 24A:
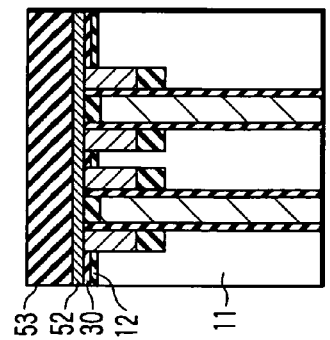
Figure 24B:
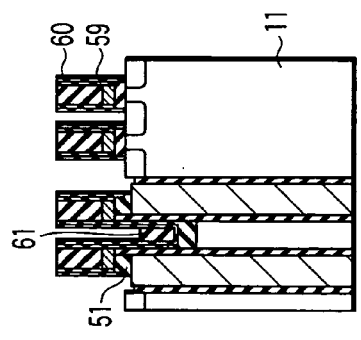

Subsequently, parts of the barrier silicon nitride film 60, BPSG film 61 and buried insulating film 51 are removed by, e.g. RIE. With the partial removal of the buried insulating film 51, a conduction path is formed between the node electrode of the trench capacitor TC and the strap electrode that is to be formed later (FIGS. 24A and 24B).

Figure 24C:
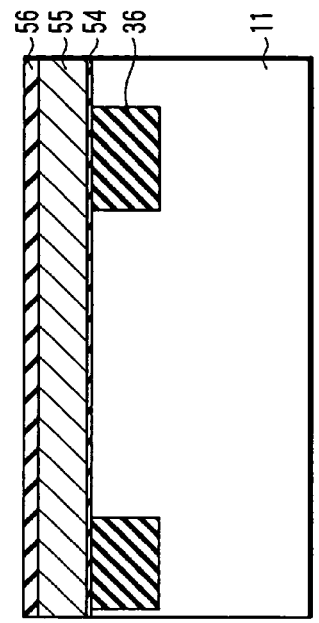

A similar step is carried out for the peripheral circuit, and the barrier silicon nitride film 60 is removed by the RIE step (FIG. 24C).

A doped polysilicon layer 63 is deposited over the entire surface by, e.g. LPCVD (Low Pressure Chemical Vapor Deposition). With this step, the strap electrode ST, which electrically connects the source electrode of the memory cell MC and one of the electrodes of the trench capacitor TC, and the bit line contact BC, are formed. Further, the polysilicon layer 63 is also deposited on the device isolation region 5 that separates the trench capacitors TC arranged adjacent along the bit line BL (FIGS. 25A to 25C).

Next, a gate structure of the peripheral circuit is formed. The BSG film 56 and polysilicon layer 55 are patterned by, e.g. RIE, thereby forming a gate electrode structure. Using the gate electrode structure as a mask, impurities are introduced in the substrate 11 and low-concentration impurity-diffused regions 57 are formed. Subsequently, a silicon oxide film, for instance, is deposited and then etched back by, e.g. RIE, so that portions thereof may remain on the side walls of the gate electrode structure. Thus, a spacer 64 is formed (FIG. 26C). This step is performed, with the memory cell side being masked (FIGS. 26A and 26B).

The BSG film 53 formed on the polysilicon layer 52, which becomes the gate electrode of the transistor TR, and the BSG film 56 formed on the gate electrode 55 of the transistor of the peripheral circuit, are removed (FIGS. 27A and 27B).

Using the gate electrode with the spacer 64 as a mask, ion implantation is performed to form high-concentration impurity regions 58. Thus, the source and drain regions of the peripheral circuit are completely formed (FIG. 27C).

Next, through salicide processes, the polysilicon layer 52 that becomes the word line WL and a high-melting-point metal layer are reacted to form a silicide layer 52S, and the polysilicon layer 63 and a high-melting-point metal layer are reacted to form a silicide layer 63S. By reacting the gate electrode 55 and a high-melting-point metal layer, a silicide layer 55S is formed. Similarly, the substrate 11 on the source and drain regions and a high-melting-point metal layer are reacted to form a silicide layer 64. In this way, the surface of each polysilicon layer is silicided, thereby reducing the wiring resistance (FIGS. 28A to 28C).

Figure 29C:
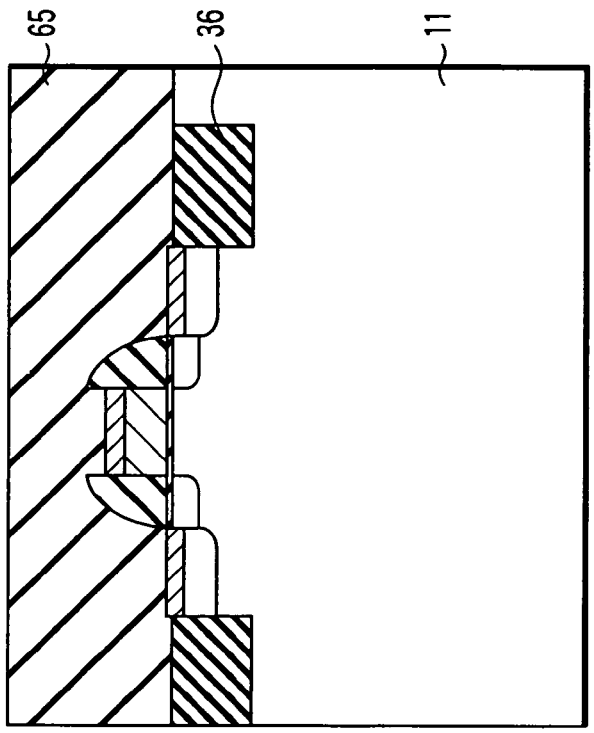
Figure 29B:
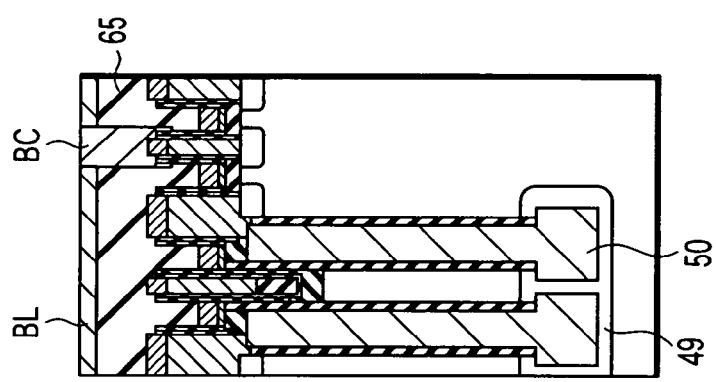
Figure 29A:
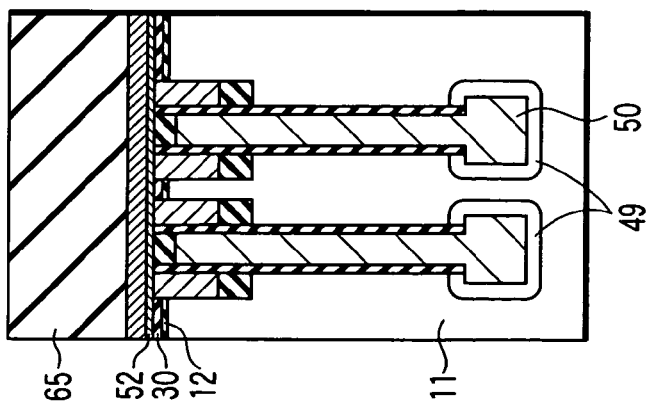

A silicon nitride film 65 is deposited on the entire surface. Through-holes that penetrate the silicon nitride film 65 are formed by, e.g. RIE. By forming buried plugs in the through-holes, a bit line contact BC<11> and source and drain contacts for the transistor of the peripheral circuit can be formed. Further, the bit line BL<1> is formed in the silicon nitride film 65 (FIGS. 29A and 29C).

Through the above-described steps, the DRAM as shown in FIGS. 3 to 6 is obtained.

The fabrication method of this embodiment has the following advantages.

The pillar FIN for forming the fin-gate type double-gate transistor is first formed, following which the trench capacitors TC are formed. Thus, as shown in FIGS. 19A and 19B, the polysilicon layer 50 can be etched sufficiently deep, by controlling the depth, time and temperature for etching the polysilicon layer 50. The depth of the etching is equal to the thickness of the buried insulating film 51 to be formed later. As mentioned above, the thickness of the buried insulating film 51 is important for electrical insulation from the word line WL. According to the present fabrication method, the thickness of the buried insulating film 51 can be freely set, as desired.

As is shown in FIGS. 22A and 22B, the regions that become the gate electrode, bit line contact BC and device isolation region 5 can be formed at a time. In other words, since the line-and-space photoresist-pattern can be used, the manufacturing cost can be reduced and a higher integration density can be achieved.

Moreover, as shown in FIGS. 28A to 28C, the word line WL, strap electrode ST, bit line contact BC and peripheral circuit can be silicided at the same time. Thus, the fabrication steps can be simplified and the manufacturing cost can be reduced.

The etching rate of the silicon nitride film 30 is lower than that of the gate electrode 38. Therefore, the gate electrode 38 can be protected at the time of etching.

The buried insulating film 51 can easily be formed, as described above. Therefore, the cost for forming it does not increase.

Since the strap electrode ST is provided, ions are not implanted deeper in the pillar FIN and the pillar FIN is not damaged. If the strap electrode ST is not used for connection, it is necessary to directly connect the source region and the trench capacitor TC. In this case, the diffusion region that becomes the source region needs to be formed deeper in the pillar FIN by ion-implantation. Consequently, the pillar FIN may be damaged in the ion-implantation step.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device with a fin-type transistor comprising:
    a projecting semiconductor region formed on a major surface of a semiconductor substrate of a first conductivity type;
    a gate electrode formed on at least opposed side surfaces of the projecting semiconductor region, with a gate insulating film interposed;
    source and drain regions of a second conductivity type formed in the projecting semiconductor region such that the source and drain regions sandwich the gate electrode;
    a channel region of the first conductivity type formed in the projecting semiconductor region between the source and drain regions;
    a device isolation insulating film formed on the semiconductor substrate such that the device isolation insulating film is interposed between the projecting semiconductor region and the semiconductor substrate,
    wherein the following relationship is established:

$$T_{FIN} \geq (\in/4qN_{CH})^{1/2}$$

where $T_{FIN}$ is a width of the projecting semiconductor region, $N_{CH}$ is an impurity concentration in the channel region, $\in$ is a dielectric constant of a semiconductor material of the projecting semiconductor region, and q is an elementary charge; and
    wherein when a gate length $L_G$ is 0.15 $\mu$m or less, and a thickness $T_{OX}$ of the gate insulating film thickness is 0.008 $\mu$m or less, a width of the projecting semiconductor in a direction perpendicular to the channel region just under the gate electrode satisfies the following relationship:

$$T_{FIN} \leq a'(T_{OX}) \times \exp(b'(T_{OX}) \times L_G)$$

where $a'(T_{OX})=0.0149\times(1-88.4\times T_{OX})$, and $b'(T_{OX})=26.3\times(1-36.2\times T_{OX})$.

2. The semiconductor memory device according to claim 1, further comprising a first insulating film provided under the projecting semiconductor region between the channel region, which is provided immediately below the gate electrode, and the semiconductor substrate, the first insulating film electrically insulating the channel region and the semiconductor substrate.

3. The semiconductor memory device according to claim 1, further comprising an impurity region of the first impurity type with a higher impurity concentration than the channel region, the impurity region being provided under the projecting semiconductor region between the channel region and the semiconductor substrate, and the impurity region electrically insulating the channel region and the semiconductor substrate.

4. The semiconductor memory device according to claim 1, wherein the gate electrode is provided to extend near a proximal part of the projecting semiconductor region, relative to the source region and the drain region, an extension portion of the gate electrode electrically insulating the channel region and the semiconductor substrate.

5. The semiconductor memory device according to claim 1, further comprising a second insulating film formed on an upper part of the projecting semiconductor region, wherein the gate electrode extends from one side to the other side of the projecting semiconductor region and straddles the second insulating film.

6. The semiconductor memory device according to claim 1, wherein the gate electrode is made of a material including polysilicon as the same conductivity type as the channel region.

7. The semiconductor memory device according to claim 1, further comprising a trench capacitor having one electrode electrically connected to the source region.

8. A semiconductor memory device with a fin-type transistor comprising:
    a projecting semiconductor region formed on a major surface of a semiconductor substrate of a first conductivity type;
    a gate electrode formed on at least opposed side surfaces of the projecting semiconductor region, with a gate insulating film interposed;
    source and drain regions of a second conductivity type formed in the projecting semiconductor region such that the source and drain regions sandwich the gate electrode;
    a channel region of the first conductivity type formed in the projecting semiconductor region between the source and drain regions; and
    a device isolation insulating film formed on the semiconductor substrate such that the device isolation insulating film is interposed between the projecting semiconductor region and the semiconductor substrate,
    wherein when a gate length $L_G$ is 0.15 $\mu$m or less, a thickness $T_{OX}$ of the gate insulating film thickness is 0.008 $\mu$m or less, an impurity concentration $N_{CH}$ of the channel region $N_{CH}$ is $5\times10^{17}$ cm$^{-3}$, and an impurity concentration $N_{SD}$ of the source region and drain region is $1\times10^{19}$ cm$^{-3}$, a width $T_{FIN}$ of the projecting semiconductor region in a direction perpendicular to the channel region just under the gate electrode satisfies the following relationship:

$$T_{FIN} \leq a(T_{OX}, N_{CH}, N_{SD}) \times \exp(b(T_{OX}, N_{CH}, N_{SD}) \times L_G)$$

where $a(T_{OX}, N_{CH}, N_{SD})=0.0173\times(1-76.3\times T_{OX}-2.43\times 10^{-19}\times N_{CH}-1.57\times10^{-20}\times N_{SD})$, and $b(T_{OX}, N_{CH}, N_{SD})=8.21\times(1+116\times T_{OX}+4.38\times 10^{-18}\times N_{CH}+1.63\times10^{-20}\times N_{SD})$.

9. The semiconductor memory device according to claim 8, further comprising a first insulating film provided under the projecting semiconductor region between the channel region, which is provided immediately below the gate electrode, and the semiconductor substrate, the first insulating film electrically insulating the channel region and the semiconductor substrate.

10. The semiconductor memory device according to claim 8, further comprising an impurity region of the first impurity type with a higher impurity concentration than the channel region, the impurity region being provided under the projecting semiconductor region between the channel region and the semiconductor substrate, and the impurity region electrically insulating the channel region and the semiconductor substrate.

11. The semiconductor memory device according to claim 8, wherein the gate electrode is provided to extend near a middle part of the projecting semiconductor region, relative to the source region and the drain region, an extension portion of the gate electrode electrically insulating the channel region and the semiconductor substrate.

12. The semiconductor memory device according to claim 8, further comprising a second insulating film formed on an upper part of the projecting semiconductor region, wherein the gate electrode extends from one side to the other side of the projecting semiconductor region and straddles the second insulating film.

13. The semiconductor memory device according to claim 8, wherein the gate electrode is made of a material including polysilicon as the same conductivity type as the channel region.

14. The semiconductor memory device according to claim 8, further comprising a trench capacitor having one electrode electrically connected to the source region.

* * * * *